(12) United States Patent
Sundaresan et al.

(10) Patent No.: US 10,763,356 B1
(45) Date of Patent: Sep. 1, 2020

(54) MANUFACTURE OF POWER DEVICES HAVING INVERSION CHANNEL

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US); Stoyan Jeliazkov, Dulles, VA (US)

(73) Assignee: GeneSiC Semiconductor Inc., Dulles, VA (US)

( * ) Notice: Subject to any disclaimer, the term of this patent is extended or adjusted under 35 U.S.C. 154(b) by 0 days.

(21) Appl. No.: 16/374,025

(22) Filed: Apr. 3, 2019

(51) Int. Cl.
*H01L 29/66* (2006.01)
*H01L 29/78* (2006.01)
*H01L 29/16* (2006.01)

(52) U.S. Cl.
CPC ...... *H01L 29/7813* (2013.01); *H01L 29/1608* (2013.01)

(58) Field of Classification Search
CPC .............. H01L 29/1608; H01L 29/41766
See application file for complete search history.

(56) References Cited

U.S. PATENT DOCUMENTS

| | | | |
|---|---|---|---|
| 2013/0049105 A1* | 2/2013 | Omori | H01L 29/41766 257/330 |
| 2013/0306983 A1* | 11/2013 | Nakano | H01L 29/0696 257/76 |
| 2018/0331174 A1* | 11/2018 | Tega | H01L 29/06 |

* cited by examiner

*Primary Examiner* — Thomas L Dickey
(74) *Attorney, Agent, or Firm* — Dave Law Group LLC; Raj S. Dave

(57) ABSTRACT

An embodiment relates to a device comprising a unit cell on a SiC substrate, the unit cell comprising a first well region, a source region, a plug region, and a well trench, wherein the well trench has a depth that is less than that of the first well region. Additional embodiments relate to the device having a second well region, wherein the second well region has a depth that is equal to or deeper than the first well region and the second well region is located under and around the source region.

19 Claims, 43 Drawing Sheets

MANUFACTURE OF POWER DEVICES HAVING INVERSION CHANNEL

RELATED APPLICATION

This application is related to U.S. Ser. No. 16/352,698, filed Mar. 13, 2019, entitled "DESIGN AND MANUFACTURE OF IMPROVED POWER DEVICES," which is incorporated herein by reference in its entirety.

FIELD OF THE INVENTION

This invention relates to power semiconductor devices using a vertical silicon carbide (SiC) double-implantation metal oxide semiconductor field-effect transistor (DMOSFET). A power metal oxide semiconductor field-effect transistor (MOSFET) is a specific type of MOSFET designed to handle significant power levels.

BACKGROUND OF INVENTION

Silicon based power devices have long dominated power electronics and power system applications. On the other hand, SiC is a wider band-gap (Eg) material with Eg=3.3 eV as compared to silicon (Eg=1.1 eV) and hence, SiC has a higher blocking voltage than Si. SiC has a higher breakdown electric field ($3 \times 10^6$ V/cm to $5 \times 10^6$ V/cm) compared to Si (breakdown electric field for Si is $0.3 \times 10^6$ V/cm) and is a better thermal conductor (3.7 (W/cm-K) for SiC versus 1.6 (W/cm-K) for Si). SiC has been a material of choice for power MOSFETs. However, "[e]ven with the successful introduction of SiC power MOSFETs into the commercial market place, several key reliability issues have not been fully resolved." [Source: Key Reliability Issues for SiC Power MOSFETs, A. Lelis, D. Habersat, R. Green, and E. Mooro of the U.S. Army Research Laboratory, published in ECS Transactions, 58 (4) 87-93 (2013), DOI: 10.1149/05804.0087ecst]

"[W]hile SiC power MOSFETs share many similarities to silicon MOSFETs, many challenging differences remain. In particular, the wide-bandgap nature of 4H-SiC (EG=3.26 eV) is both a blessing and a curse, bringing a low intrinsic carrier concentration and a high critical electric field, while presenting challenges with inversion-layer mobility and reliability in passivating dielectric layers." [Source: Challenges in SiC Power MOSFET Design by Kevin Matocha of the GE Global Research Center—Semiconductor Technology Laboratory, Niskayuna, N.Y. USA, published in ISDRS 2007, Dec. 12-14, 2007, College Park, Md., USA]

SiC exists in a kind of polymorphic crystalline building known as a polytype, e.g. 3C—SiC, 4H-SiC, 6H-SiC. FIG. 1 is the prior art SiC DMOSFET structure reported by B. J. Baliga in Advanced High-Voltage Power Device Concepts (Springer Press, 2011).

In a typical SiC planar MOSFET structure as that shown in FIG. 1 the metal oxide semiconductor (MOS) channel is formed on the horizontal or 0001 crystal plane of SiC. The channel mobility or field effect mobility on the 0001 crystal plane of SiC tends to be lower as compared to the vertical side wall or what is called as the 11-20 or 10-10 crystal plane. The channel mobility or field effect mobility on the 0001 crystal plane of SiC is in the range of 15 to 25 cm2/V-sec as compared silicon MOSFETs where it can be more than 350 cm2/V-sec. When one makes a planar SiC DMOSFET, the ON resistance tends to be large and the MOSFET is limited by the field effect channel mobility. Therefore, there is a long-felt need for improved power devices that addresses the low channel mobility and high ON resistance in SiC MOSFET.

SUMMARY OF INVENTION

An embodiment relates to a device comprising a unit cell on a SiC substrate, the unit cell comprising: a first well region, a source region, a plug region, and a well trench, wherein the well trench has a depth that is less than that of the first well region.

In an embodiment, the source region located is within the first well region.

In an embodiment, at least a portion of the plug region is located at a center of the unit cell.

In an embodiment, the plug region is located between a source interconnect metallization region and the SiC substrate.

In an embodiment, the plug region is located between at least two well regions.

In an embodiment, the plug region is located between at least two source regions.

In an embodiment, the plug region is partially within the source region and extends beyond the source region.

In an embodiment, at least a portion of the first well region is located between the source region and the SiC substrate.

In an embodiment, the device further comprises a drift layer.

In an embodiment, the drift layer is located on the SiC substrate.

In an embodiment, the unit cell is located within the drift layer.

In an embodiment, the device further comprises a second well region.

In an embodiment, the second well region has a depth that is equal to or deeper than the first well region.

In an embodiment, the second well region is located under and around the source region.

In an embodiment, a lateral extent of the second well region is larger than the first well region.

In an embodiment, the second well region is located between the source region and the SiC substrate.

In an embodiment, the device comprises a n-type MOSFET or p-type MOSFET.

In an embodiment, the device comprises a n-type DMOSFET or p-type DMOSFET.

In an embodiment, the device further comprises a drain region and a gate region.

In an embodiment, the device further comprises an interlayer dielectric.

DETAILED DESCRIPTION

Definitions and General Techniques

Figure 1:
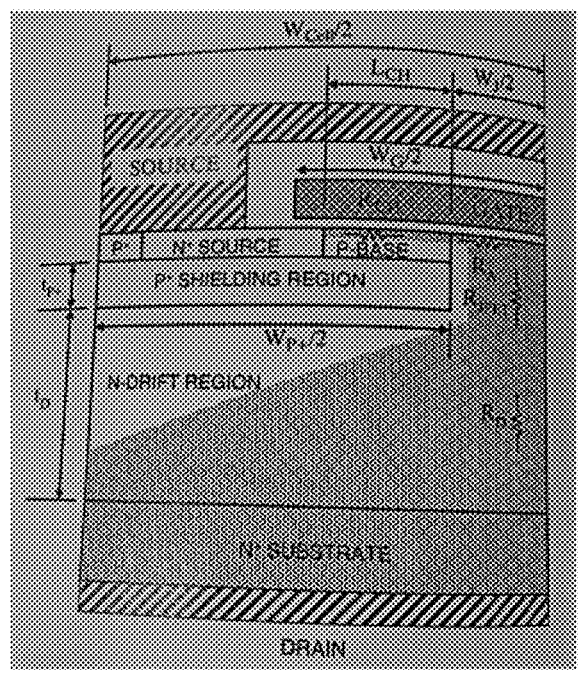
FIG. 1 shows the prior art SiC DMOSFET structure

Unless otherwise defined herein, scientific and technical terms used in connection with the present invention shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques of the present invention are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

The following terms and phrases, unless otherwise indicated, shall be understood to have the following meanings.

The term "unit cell" as used herein refers to a piece of a pattern in a semiconductor which is repeated in the semiconductor.

The term "SiC" as used herein refers to silicon carbide which is a compound semiconductor and is a mixture of silicon and carbon with the chemical formula SiC. Silicon is covalently bonded with carbon. In 4H-SiC, 4H is written in the Ramsdell classification scheme where the number indicates the layer and the letter indicates the Bravais lattice. That means in a 4H-SiC structure four hexagonal layers of SiC are present. SiC exists in a kind of polymorphic crystalline building known as a polytype, e.g. 3C—SiC, 4H-SiC, 6H-SiC. Presently 4H-SiC is used in power device manufacturing.

The term "substrate" as used herein refers to the supporting material on or in which the components of an integrated circuit are fabricated or attached.

The term "JFET" as used herein refers to junction gate field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a pn-junction. In an insulated-gate FET, the gate is isolated from the channel by an insulating layer so that the gate and channel form a capacitor with the insulating layer as the capacitor dielectric.

The term "MOSFET" as used herein refers to metal oxide semiconductor field-effect transistor. which is a four terminal device with source (S), gate (G), drain (D) and body (B) terminals. The body of the MOSFET is frequently connected to the source terminal so making it a three terminal device like field effect transistor.

The term "DMOSFET" as used herein refers to double-implantation metal oxide semiconductor field-effect transistor. A common physical structure of SiC MOSFETs is the planar double-implanted MOSFET in 4H-SiC (SiC-DMOSFET).

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor, The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "impurity" as used herein refers to a foreign material present in a semiconductor crystal, such as boron or arsenic in silicon, which is added to the semiconductor to produce either p-type or n-type semiconductor material, or to otherwise result in material whose electrical characteristics depend on the impurity dopant atoms.

The term "PN junction" as used herein refers to the interface and region of transition between p-type and n-type semiconductors.

The term "polysilicon" as used herein refers to a polycrystalline form of silicon.

The term "p-type" as used herein refers to extrinsic semiconductor in which the hole density exceeds the conduction electron density.

The term "bandgap" as used herein refers to the difference between the energy levels of electrons bound to their nuclei (valence electrons) and the energy levels that allow electrons to migrate freely (conduction electrons). The band gap depends on the particular semiconductor involved.

The term "breakdown" as used herein refers to a sudden change from high dynamic electrical resistance to a very low dynamic resistance in a reverse biased semiconductor device (e.g., a reverse biased junction between p-type and n-type semiconductor materials) wherein reverse current increases rapidly for a small increase in reverse applied voltage, and the device behaves as if it had negative electrical resistance.

The term "channel" as used herein refers to a path for conducting current between a source and drain of a field effect transistor.

The term "chip" as used herein refers to a single crystal substrate of semiconductor material on which one or more active or passive solid-state electronic devices are formed. A chip may contain an integrated circuit. A chip is not normally ready for use until packaged and provided with external connectors.

The term "contact" as used herein refers to the point or part of a conductor which touches another electrical conductor or electrical component to carry electrical current to or from the conductor or electrical component.

The term "die" as used herein refers to a tiny piece of semiconductor material, separated from a semiconductor slice, on which one or more active electronic components are formed. It is sometimes called a chip.

The term "sinker" as used herein refers to deep implanted regions at key locations within the DMOSFET structure The term "plug" as used herein refers to the structure used to ground the well and the source contact.

The term "drift layer" as used herein refers to lightly doped region to support the high voltage in power MOSFET The term "well" used herein refers certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "p-type" region called "p-well". This ensures that the leakage between two transistors, through the bottom side, is low due to the reverse bias between the transistor areas and the well region.

The term "source interconnect metallization" as used herein refers to interconnection metallization that interconnects many MOSFETs using fine-line metal patterns.

The term "self-aligned" used herein refers to processing steps in manufacturing of semiconductor devices. It is often necessary to achieve precise alignment between structures fabricated at different lithographic stages of integrated circuit fabrication. Stringent requirements on lithographic alignment tolerance can be relaxed if the structures are "self-aligned" which means one is forced into a specific position relative to the other for a wide range of lithographically defined positions.

The term "device" as used herein refers to the physical realization of an individual electrical element in a physically independent body which cannot be further divided without destroying its stated function.

The term "surface" as used herein refers to the outer or exterior boundary of a thing.

The term "trench" as used herein refers to electrical isolation of electronic components in a monolithic integrated circuit by the use of grooves or other indentations in the surface of the substrate, which may or may not be filled with electrically insulative (i.e., dielectric) material.

The term "dielectric" as used herein refers to a non-conductor of electricity, otherwise known as an insulator.

The term "mobility" as used herein refers to the facility with which carriers move through a semiconductor when subjected to an applied electric field. Electrons and holes typically have different mobilities in the same semiconductor.

The term "ME" as used herein refers to reactive ion etching which is an etching technology used in microfabrication. RIE is a type of dry etching which has different characteristics than wet etching. ME uses chemically reactive plasma to remove material deposited on wafers. The plasma is generated under low pressure (vacuum) by an electromagnetic field. High-energy ions from the plasma attack the wafer surface and react with it.

The term "ICP" as used herein refers to inductively coupled plasma etching technology often used in specialty semiconductor markets for device manufacturing. This technology can combine both chemical reactions and ion-induced etching. The independent control of ion flux enables high process flexibility. ICP etching is based on the use of an inductively coupled plasma source. The ICP source generates a high-density plasma due to inductive coupling between the RF antenna and the plasma. The antenna, located in the plasma generation region, creates an alternating RF magnetic field and induces RF electric fields, which energize electrons that participate in the ionization of gas molecules and atoms at low pressure. Due to the absence of an electric field near the reactor walls there is virtually no ion bombardment or erosion of the walls.

The term "CVD" as used herein refers to chemical vapor deposition is method used to produce high quality, high-performance, solid materials, typically under vacuum. The process is often used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber.

The term "PECVD" as used herein refers to plasma-enhanced chemical vapor deposition process used to deposit thin films from a gas state (vapor) to a solid state on a substrate. Chemical reactions are involved in the process, which occur after creation of a plasma of the reacting gases.

The term "LPCVD" as used herein refers to low pressure chemical vapor deposition technology that uses heat to initiate a reaction of a precursor gas on the solid substrate. This reaction at the surface is what forms the solid phase material.

The term "DIBL" as used herein refers to drain induced barrier lowering and is a short-channel effect in MOSFETs referring originally to a reduction of threshold voltage of the transistor at higher drain voltages. In a classic planar field-effect transistor with a long channel, the bottleneck in channel formation occurs far enough from the drain contact that it is electrostatically shielded from the drain by the combination of the substrate and gate, and so classically the threshold voltage was independent of drain voltage. In short-channel devices this is no longer true: The drain is close enough to gate the channel, and so a high drain voltage can open the bottleneck and turn on the transistor prematurely.

Embodiments relate to SiC DMOSFET power devices where the p-well regions effectively shield the sensitive gate oxide from the high electric fields present in SiC especially during high drain bias or blocking mode operation.

An embodiment relates to using a P+-plug to ground the p-well region with the N+ source contact.

An embodiment relates to increasing MOS channel density.

An embodiment relates to increasing effective field-effect mobility.

An embodiment relates to improved device reliability.

An embodiment relates to reducing ON resistance for a given chip size.

An embodiment relates to a p-well trench formed by dry etching into the p-well implanted region immediately preceding the source region formation, resulting in a portion of the MOS channel that is formed on the (0001) or horizontal face and another portion of the MOS channel that is formed on the (11-20/10-10) or vertical crystal plane of SiC which has the benefit of increasing the MOS channel mobility.

An embodiment relates to a much deeper vertical MOS channel formed by etching all the way through the p-well region. Subsequently, after the formation of the N+ Source region, a second p-well region (PW #2) is ion-implanted under and around the N+ source region in order to suppress reach-through breakdown.

An embodiment relates to the formation of the p-well trench which offers the flexibility to the device designer to either increase the effective channel length for a given ON resistance target, or reduce the ON resistance for a given chip size SiC devices in power electronics feature fast switching times, high blocking voltage capabilities, and the ability to operate at high temperatures. These characteristics, along with recent advancements in manufacturing processes, suggest that SiC has the potential to revolutionize power electronics as a successor to traditional silicon-based (Si) devices. SiC is a wide band gap material (3.3 eV) and has higher breakdown electric field ($3 \times 10^6$ V/cm to $5 \times 10^6$ V/cm) compared to Si (Si band gap is 1.1 eV and breakdown electric field for Si is $0.3 \times 10^6$ V/cm). SiC is a better thermal conductor (3.7 (W/cm-K) for SiC versus 1.6 (W/cm-K) for Si) which enables SiC devices to operate at extremely high-power levels and still dissipate the large amounts of excess heat generated. These material properties of SiC offer multiple advantages of using SiC instead of Si on power devices. In a comparison of SiC and Si semiconductor die with identical structures and dimensions, the SiC die exhibit a lower specific ON resistance and a higher breakdown voltage than the Si die.

The disclosed embodiments herein provide novel techniques for SiC DMOSFET design and fabrication to have a higher channel density, which can be advantageous for reducing the ON resistance of the device.

In a typical SiC planar MOSFET structure also known as the DMOSFET, the MOS channel is formed on the horizontal or 0001 crystal plane of SiC. The channel mobility or field effect mobility on the 0001 crystal plane of SiC tends to be lower as compared to the vertical side wall or what is called as the 11-20 or 10-10 crystal plane. When one makes a planar SiC DMOSFET, the ON resistance tends to be large and the DMOSFET is limited by the field effect channel mobility.

The channel mobility or field effect mobility on the 0001 crystal plane of SiC is in the range of 15 to 25 cm2/V-sec as compared silicon MOSFETs where it can be more than 350 cm2/V-sec. One way to design lower resistance SiC MOSFETs is to find ways in which you can create very small channel lengths, so that this inversion layer mobility is active only in a smaller region of the current conduction path of this device, but this can lead to problems of short channel effects. Hence, reducing the channel alone does not solve the low channel mobility in the 0001 crystal plane because it introduces short channel effects, which results in poor reliability and poor robustness characteristics for this device. In an embodiment herein one way to combat this problem is by introducing trench MOSFETs in SiC. In a trench MOSFET, instead of forming the MOS channel on a horizontal or a 0001 crystal plane, the channels are now formed on the vertical side wall or on the so called A plane or M plane or also called as 10-10 or the 11-20 planes. Both of these planes have significantly higher channel mobility close to five times higher as compared to the horizontal plane resulting in 110 to 120 cm2/V-sec for vertical channels.

A trench MOSFET can provide a higher channel density as compared to a planar MOSFET so one can increase the packing density. Since channel mobility is higher, it enables devices with small ON resistance. Even though a traditional trench MOSFET has an advantage over DMOSFET, the problem with a traditional trench MOSFET structure in SiC is that at the base of the trench there are high electric fields and a portion of a gate oxide in the trench suffers from high electric fields in the blocking mode of operation. This will become a failure point of a typical trench MOSFET structure and to overcome this issue it is necessary to shield the gate oxide at the base of the trench. P-type implantations used to shield gate oxide and approaches like a W-trench MOSFET are used to shield the gate oxide.

However, creating these shielding regions increases the ON resistance. While the trench MOSFET as compared to the DMOSFET enables higher channel mobilities hence reducing the ON resistance it creates high electric fields at the trench corners. To combat this, shielding regions are introduced, but this increases the ON resistance. Some benefits gained by reduced ON resistance from the trench MOSFET, is now lost due to shielding which is a trade off in designing traditional trench MOSFET.

In the embodiments herein, the device is neither pure DMOSFET nor is it a pure trench MOSFET. In this device the MOS channel is formed on both the 0001 plane as well as the vertical side wall or 11-20 (or 10-10) plane so it is a hybrid between a DMOSFET and a trench MOSFET.

In the embodiment herein, the device has a shorter overall channel length as compared to a pure DMOSFET but with the same effective channel mobility. By increasing the channel length in this way enables you to overcome some of the robustness and reliability problems associated with making short channel DMOSFETs. In the embodiments herein, the device has the trench which is completely surrounded or encompassed in a p-type implanted region. This provides a natural shielding to the high electric fields. Since the trench is completely formed inside a p-well there is no region where the trench is exposed to n-type epilayer which mitigates the issue of high electric fields at the trench corners.

In the embodiments herein, the structure of this device is distinguished by a trench which is etched into the p-well region and this trench is referred to as the p-well trench. In the embodiment first, the p-well region is formed and then the trench is etched into the p-well region, so all sides of this trench are encompassed in this p-well region. This trench also immediately precedes the formation of the N+ source region. With this process as described in this embodiment the device has a portion of the MOS channel which is formed on the 0001 phase and another portion of the channel is formed on the 11-20 or 10-10 plane.

The main steps to form a device described in the embodiment is forming the p-well region, by either ion implantation or epitaxial growth with aluminum or boron as the p-type impurity. Then the p-well trench is formed by controlled etching into the p-well region by using either reactive ion etching (ME), or higher power inductively coupled plasma (ICP) source with an appropriate hard mask layer for forming this trench.

In the embodiment herein, this trench maybe formed with a sidewall angle between 70° and 90°. That is the approximate angle with which the trench is formed. The depth of this trench as an example may range between 0.1 μm to 0.5 μm. The depth of the p-well trench maybe adjusted to be smaller than the depth of the p-well region where the bottom of the p-well trench is completely enclosed within the p-well region.

In the embodiment herein, after forming the p-well trench, a N+ source region is formed by ion implantation or by epitaxial re-growth by using an impurity such as nitrogen or phosphorus. The N+ source is fully contained within the p-well region and N+ source does not extend beyond the p-well region. In the embodiments herein, one option is that the p-well trench region maybe formed using the same masking step as what may be used for forming the N+ source region even though it is not required. Next a P+ plug layer for grounding the p-well is formed by implantation of either aluminum or boron. The depth of the P+ plug layer may exceed the depth of the source implant layer such that it can both short the source implant with the ohmic layer that is put on top and also provides the grounding for the p-well region. The remainder of the process constitutes heat treatment of the wafers for electrical activation, the electric formation, gate metal formation, interlayer dielectric (ILD), patterning ILD, ohmic metallization, putting down a thick pad metallization.

In the embodiments herein, for forming the gate insulator either thermal oxidation or chemical vapor deposition (CVD) of a dielectric layer such as silicon dioxide, silicon nitride or oxynitride is used. In SiC, the oxidation rates are different for the 0001 plane as compared to the 11-20 or 10-10 plane which means oxidation rates are different for the horizontal side wall and the vertical side wall. This can lead to thicker gate oxide on the vertical side wall as compared to the horizontal side wall. In the embodiments herein, you can deposit a CVD silicon dioxide, and make sure that the thickness is the same on the horizontal and vertical side The p-well trench is formed preceding the source region formation and after the p-well region formation in an embodiment with SiC DMOSFETs described herein. A portion of the MOS channel in the device is now formed parallel to the 0001 plane and another portion is formed parallel to the 11-20 plane. A MOSFET which is fabricated according to this embodiment as compared to a planar device for the same lateral footprint will have a higher channel density, hence enabling for a tighter packing. In addition to geometrically increasing the channel density the embodiment herein can also take advantage of the higher channel mobility of the vertical side wall.

In the embodiments herein devices have higher channel density and higher channel mobility and lower ON resistance. For a given ON resistance target you can increase the effective channel length. While comparing the device described in an embodiment to a typical planar DMOSFET, for the same ON resistance target, you can have a higher channel length for the device in the embodiment. Short channel effects can degrade the reliability and robustness characteristics and the longer channel length can alleviate short channel effects. Another way to use the device in this embodiment is for the same channel length as in a planar DMOSFET you can realize a smaller chip which means a lower cost device.

The device in this embodiment can have the same channel length as the planar DMOSFET but because of the higher channel mobility of 11-20 and 10-10 direction one can afford a longer channel in the vertical side wall and still have a shorter, horizontal channel. Due to higher channel mobility, the device in the embodiment will have a lower ON resistance. It allows you to then have a smaller chip size for the same ON resistance and design a device as in the embodiment which has a longer channel in the vertical and shorter on the horizontal, allowing to make a lower ON resistance MOSFET.

The embodiments described herein, can be distinguished from a prior art disclosed by Tega et al from Hitachi in a US patent application: US 2018/0331174 A1, published in November of 2018. The prior art structure described by Tega et al from Hitachi in the US patent describes a SiC MOSFET structure in which the MOS channel is formed on both the horizontal and vertical p-well surfaces and the p-well trench which creates this MOS channel on the vertical and horizontal side walls is not formed contiguously. The p-well trench is only formed at orthogonal locations in the 3D landscape. If it were formed contiguously a cross section anywhere in the device will show the same structure. But in the case of the prior art the cross section through those kinds of trenches shows a different cross section at each location since there are many regions in the device where there is no p-well trench. The p-well trench in the devices described in the embodiments herein are however contiguous in nature which is thus different from the prior art structure described by Tega et al from Hitachi.

The second difference is that the construction of the MOS channel in the prior art structure described by Tega et al from Hitachi is completely different when compared to what is described in the embodiments here. The MOS channel in the prior art is formed between an N+ source region and a separate N+ accumulation region. In the device in the embodiments described herein the p-well region is formed first followed by a trench into the p-well region, and then the source implant. However, in the prior art structure described by Tega et al from Hitachi the p-well region is formed followed by the source implant, an accumulation region, the heat treatment and then a p-well trench. The difference lies in how and when MOS channel is formed during the process.

The third difference is that the process of trench creation for realizing MOS channel on the vertical SiC crystal planes is conducted after all implantation steps are completed in the prior art described by Tega et al from Hitachi. As a result, the N+ Source region is elevated as compared to the MOS channel formed on the vertical sidewall. In the device described in the embodiments herein the p-well trench is etched immediately following the p-well implantation and prior to the N+ source implantation which is formed on the recessed region created by the etching of the p-well trench.

In the structure proposed by Tega et all, along with a P+ plug region, N+ source region, and p-well region has N+ accumulation region and a P+ shielding region.

An embodiment described herein enables you to form an extremely long channel on the vertical side wall. The p-well trench can be formed significantly deeper so that the bottom of the p-well trench can extend beyond the p-well region.

In an embodiment herein, p-well region is formed followed by a deep p-well trench and source implantation. After the source implantation a second p-well region is formed. The second p-well region extends below the source region and has a cover around the corner to prevent any reliability issues of having a sharp edge.

In the embodiment herein, tilted implantation is used to extend the p-well region beyond the lateral extent of the p-well region and shield the gate oxide from any drain induced electric field. The structure in the embodiment provides a natural way to shield the drain potential from the channel region by extending the second p-well region beyond the source region The process to form the device described in the embodiment includes forming a p-well region by ion implantation or epitaxial growth using aluminum or boron. This is followed by a p-well trench that is formed by control etching into the p-well region by RIE or ICP based etching. The p-well trench may be formed with a sidewall angle between 75° and 90°. The depth of the p-well trench region may range anywhere from 0.1 µm to 2 µm. A N+ Source region is then formed by ion-implantation or by epitaxial re-growth by a n-type impurity such as nitrogen or phosphorus. In the embodiment herein, since the bottom of the p-well trench may not be completely enclosed within the p-well region, a second p-well region is formed. The second p-well is formed with a sufficient depth under the N+ source region while making sure that the lateral extent of the p-well region is then now larger than the original p-well region.

There are two methods to forming the second p-well as described in the embodiments here. In one case a dedicated hard mask layer may be deposited and patterned with a slightly larger extent than the original p-well region, and then the ion-implantation for PW #2 may be performed. In the second case tilted ion-implantation may be advantageously used for realizing PW #2. In an embodiment described here, the same hard mask may be used for creating the p-well trench, N+ source region and then the PW #2 region, whose lateral extent is made larger than the original PW region using tilted ion-implantation of a p-type impurity. The remainder of the process constitutes heat treatment of the wafers for electrical activation of the implanted impurities, gate insulator formation, gate electrode formation, inter-level dielectric formation, Source/Drain Ohmic metallization and finally the formation of pad or interconnect metals compatible with die probing and packaging. The gate insulator is formed either by thermal oxidation of the silicon carbide or by CVD of a dielectric layer such as silicon dioxide, silicon nitride, silicon oxynitride, etc.

The device described in the embodiment allows more freedom in the ON resistance versus robustness trade off that is often encountered in case of SiC power MOSFET. While longer channels allow you to have good short circuit performance and the ON resistance is high because of the lower channel mobility an intrinsic property if SiC.

Figure 2:
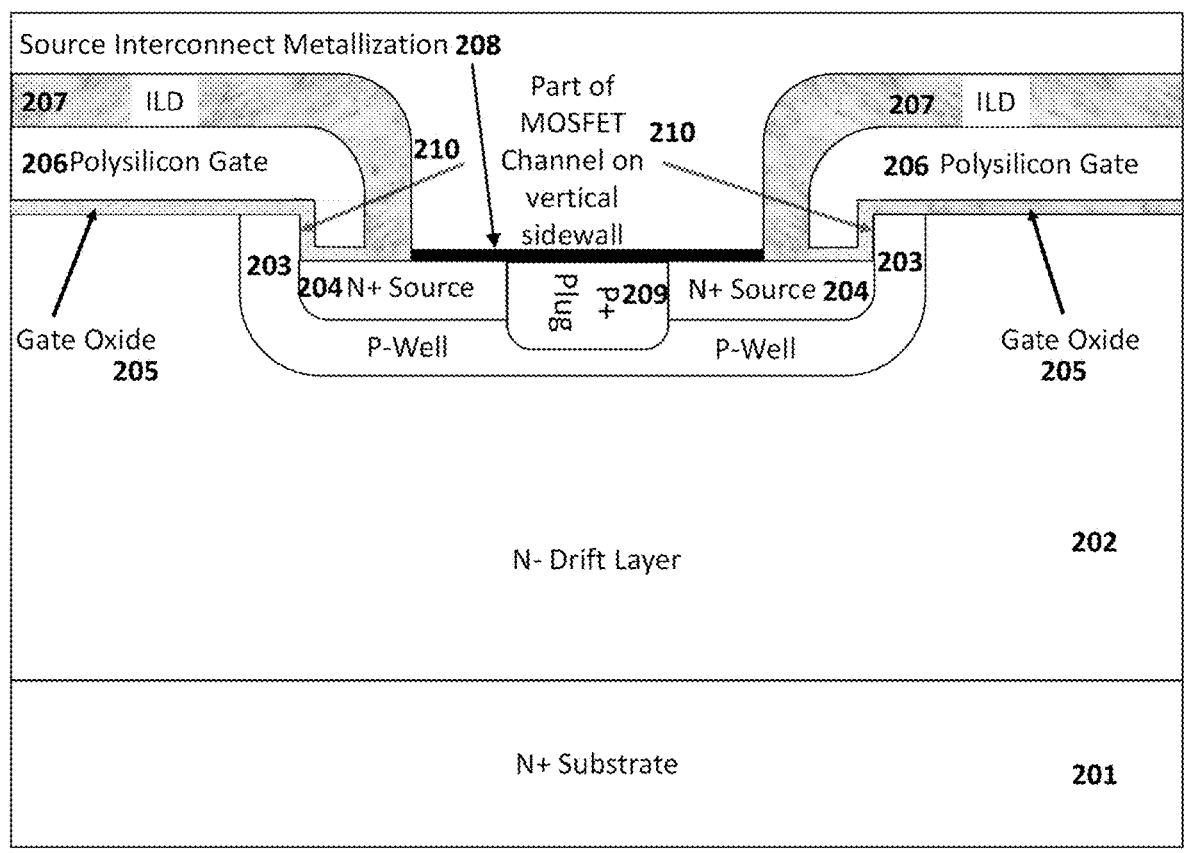
FIG. 2 shows an embodiment of a SiC DMOSFET with a portion of the MOS channel on (1000) and a second portion on (11-20) or (11-00) crystal planes.

An embodiment shown in FIG. 2 is the unit cell of a cross-sectional structure of a SiC DMOSFET. The key regions of this device are a p-well region 203, which is formed by ion-implantation or epitaxial re-growth of a p-type species such as aluminum or boron. There is an N+ source region 204, N− drift layer 202, and an N+ substrate 201. In the ON state when a gate voltage is applied to the polysilicon gate 206, the current flows vertically from the drain 201, through the inversion layer which is formed at the top of the p-well layer 203, through the N+ source region 204, and out through the source metallization 208. In the OFF state or the blocking state, a voltage is supported across the p-well 203, N− drift layer 202 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 205. Another feature is an ILD layer 207 which is used to insulate the source interconnect metallization 208 from the polysilicon gate 206. At the very center of the unit cell, there is a P+ plug layer 209 which is grounded with the N+ source metallization. The purpose of the P+ plug in SiC DMOSFET is to ground the p-well region with the N+ source contact.

The p-well region 203 is first formed by ion-implantation or epitaxial growth using aluminum or boron as the p-type impurity. Then, a p-well trench 210 is formed by controlled etching into the p-well region 203 by either RIE or ICP etching using an appropriately patterned hard mask layer. The p-well trench may be formed with a sidewall angle between 70° and 90°. The depth of the p-well trench region 210 may range from 0.1 µm to 0.5 µm. The depth of the p-well trench can be adjusted to be shallower than the depth of the p-well region. The bottom of the p-well trench may be enclosed within the p-well region. A N+ source region is then formed by ion-implantation or by epitaxial re-growth by a n-type impurity such as nitrogen or phosphorus. The p-well trench region may be preferably formed using the same masking step used for performing the ion-implantation necessary for forming the N+ source region 204. A P+ plug layer 209 may be formed by implantation of a controlled dose of a p-type impurity such as aluminum or boron. The depth of the P+ plug layer may exceed the depth of the N+ source implant and may even exceed the depth of the p-well region, in a particular implementation. The remainder of the process constitutes heat treatment of the wafers for electrical activation of the implanted impurities, gate insulator formation, gate electrode formation, inter-level dielectric formation, source/drain ohmic metallization and finally the formation of pad or interconnect metals compatible with die probing and packaging. The gate insulator 205 is formed by thermal oxidation or using CVD of a dielectric layer such as silicon dioxide, silicon nitride, silicon oxynitride, etc.

In the embodiment herein, the trench is formed into the p-well region immediately preceding the formation of the N+ source region A portion of the MOS channel is formed parallel to the (0001) crystal plane, while another portion of the MOS channel is formed parallel to the (11-20) or (1-100) crystal plane of SiC. The DMOSFET fabricated according to this embodiment will have a higher channel density, which can be advantageous for reducing the ON resistance of the device. It is well-known to those in the field of the invention that MOS channels formed on vertical sidewalls, parallel to (11-20) or (10-10) crystal planes of 4H-SiC, can achieve much high field-effect mobility as compared to the MOS channels formed on the flat (0001) crystal planes. In an embodiment described here, in addition to increasing the channel density, the effective channel mobility for a DMOSFET fabricated according to this embodiment is expected to be higher than for a DMOSFET fabricated with its MOS channel always parallel to the (0001) crystal plane of 4H-SiC. This desirable feature can be exploited for increasing the effective channel length for a given ON resistance target or reducing the ON resistance for a given chip size, whichever may be of interest to the device designer.

The embodiment described in this application can be distinguished from the device disclosed by Tega et al. in US patent application: US 2018/0331174 A1 [henceforth referred to as Ref 1], even though that application describes a SiC MOSFET structure in which the MOS channel is formed on vertical and horizontal p-well surfaces:

(1) In Ref.1 the MOS channel on the vertical SiC crystal planes is not formed contiguously but only formed at discrete orthogonal locations in the active area. So, there are cross-sections through the Ref. 1 MOSFET that do not contain any MOS channel formation on the vertical SiC sidewall.

(2) The MOS channel construction in Ref.1 is completely different compared to that described in the embodiments herein. In Ref.1, the MOS channel is formed between an N+ source region and a separate N+ accumulation region, which connects the MOS channel to the JFET region (3) In Ref.1, the process of trench creation for realizing MOS channel on the vertical SiC crystal planes is conducted after all implantation steps are completed. As a result, the N+ source region is elevated as compared to the MOS channel formed on the vertical sidewall. In the embodiment described herein, the p-well trench is etched immediately following the p-well implantation and prior to the N+ source Implantation which is formed on the recessed region created by the etching of the p-well trench.

Figure 3A:
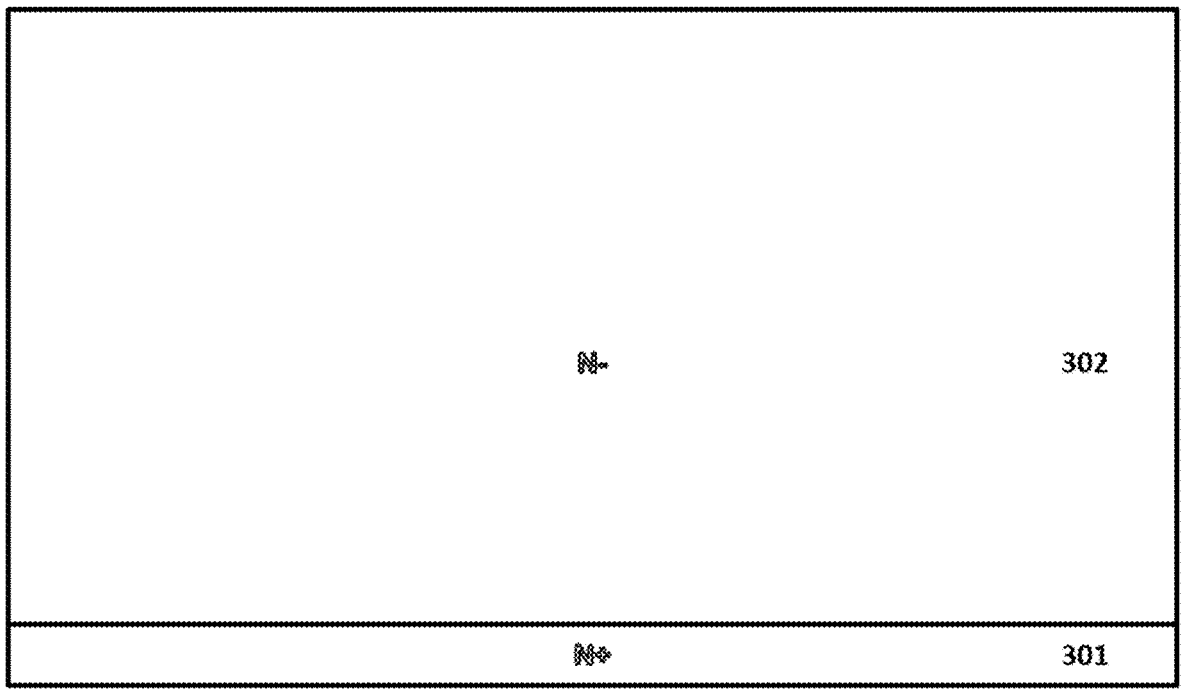
FIG. 3a to FIG. 3u are cross sectional views showing the process steps for manufacturing the SiC DMOSFET structure in FIG. 2.
Figure 3B:
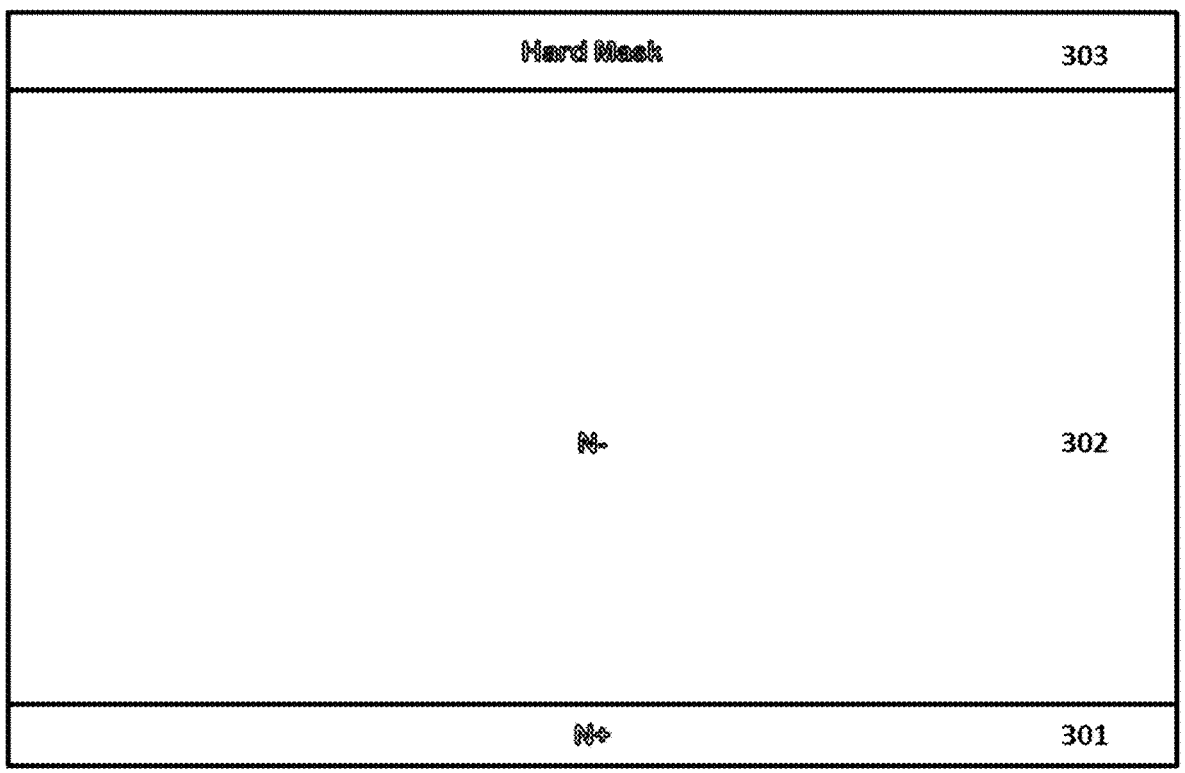
Figure 3C:
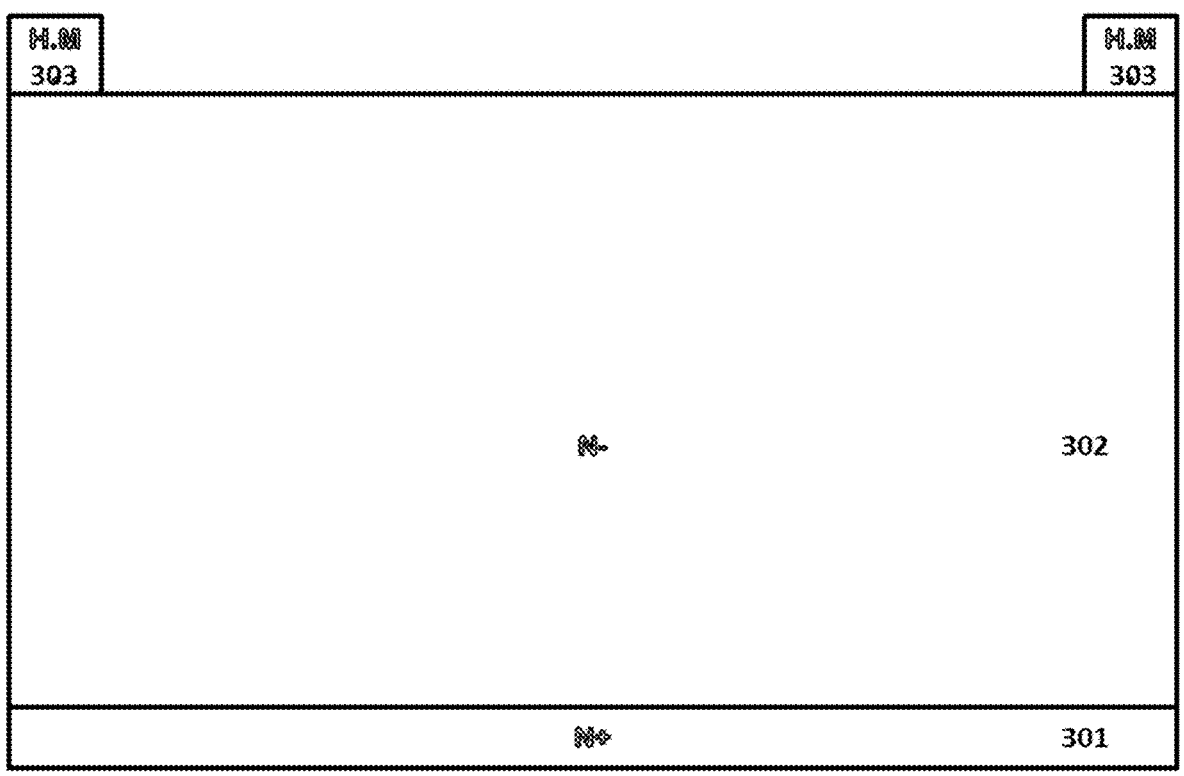
Figure 3D:
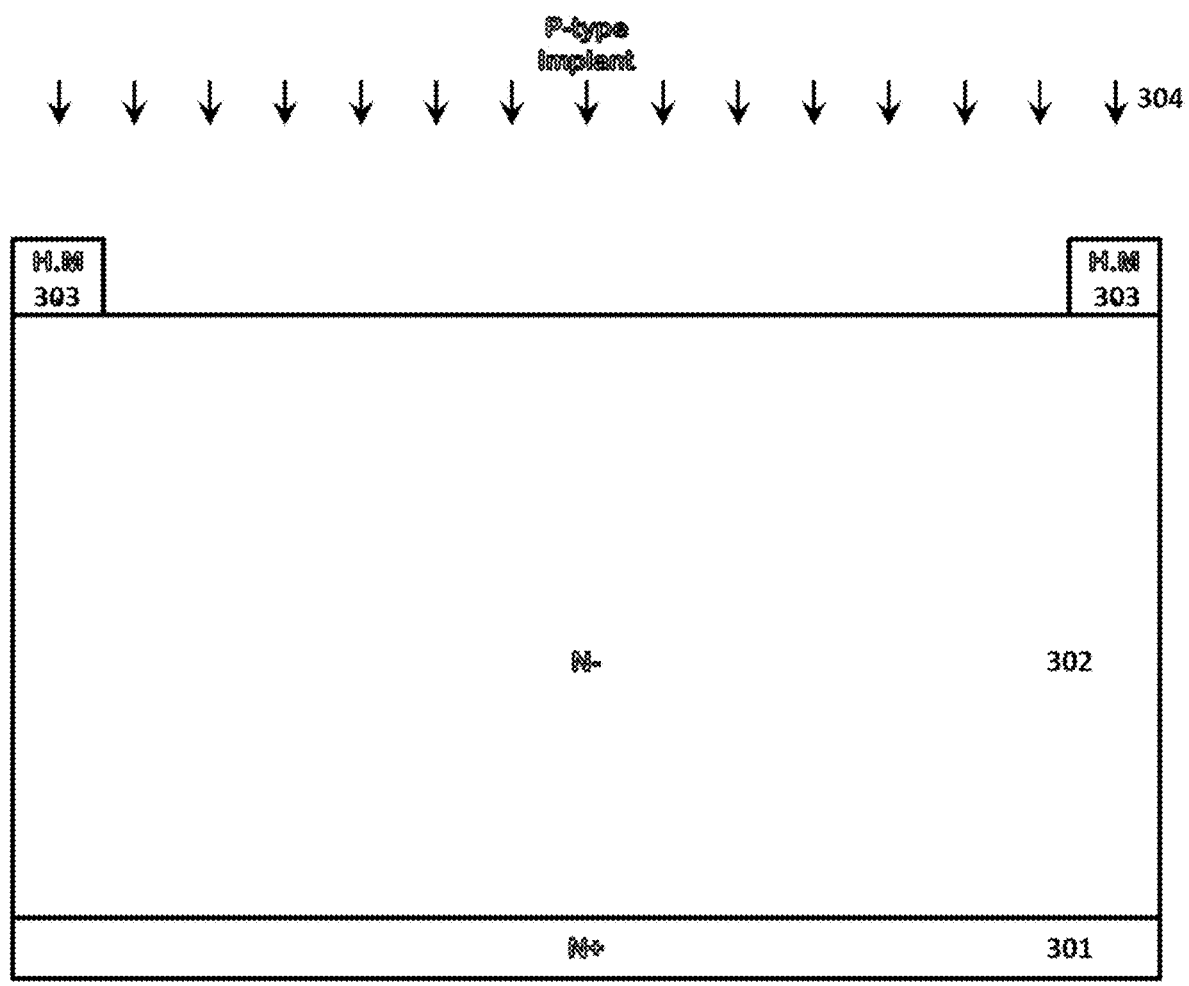
Figure 3E:
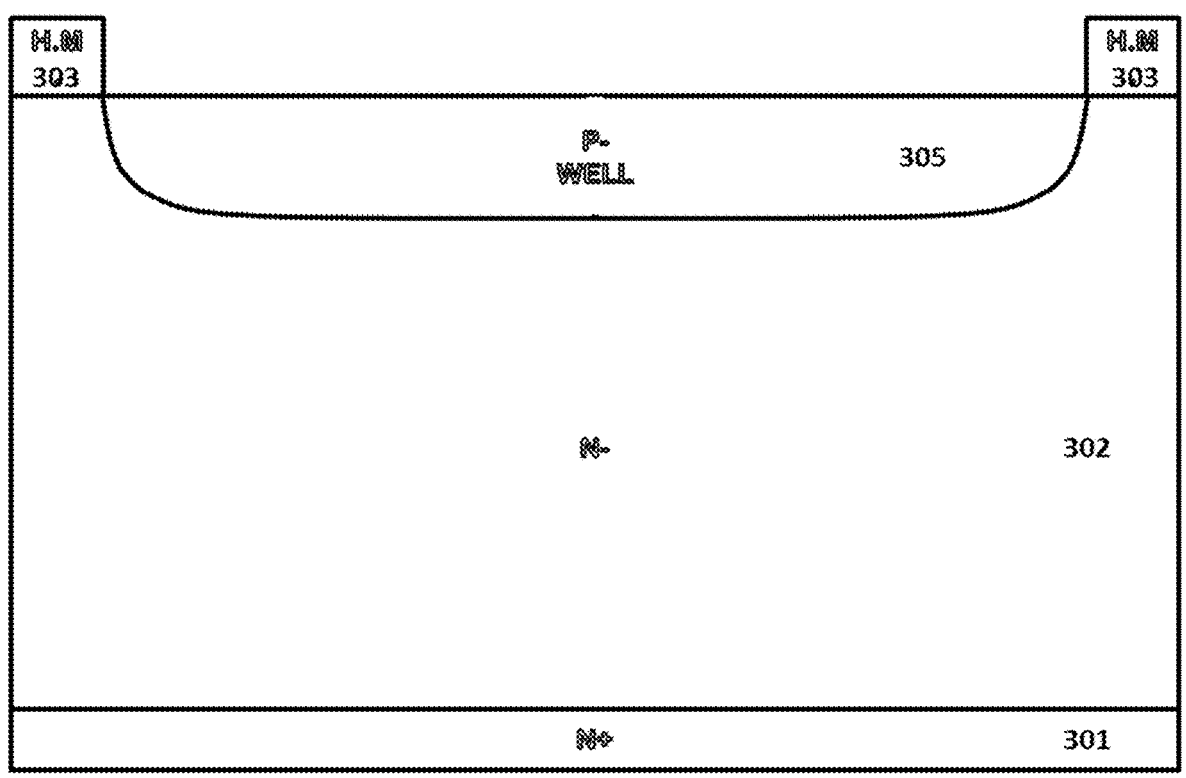
Figure 3F:
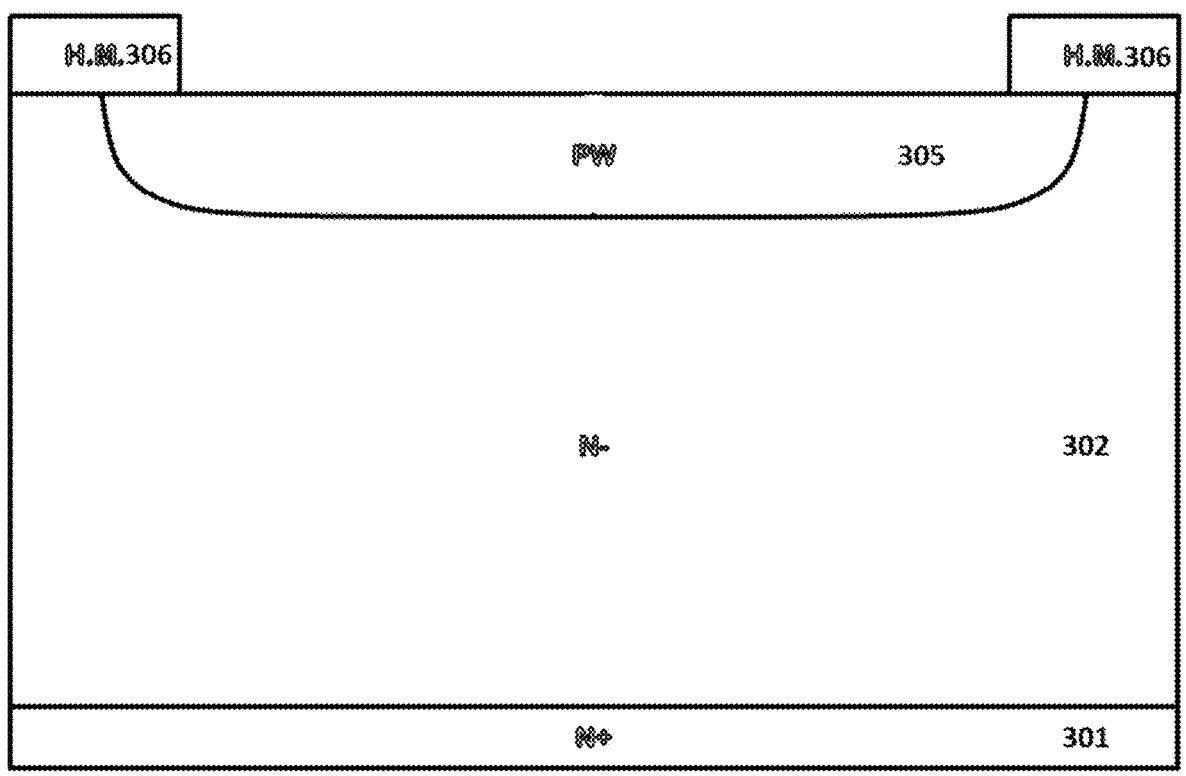
Figure 3G:
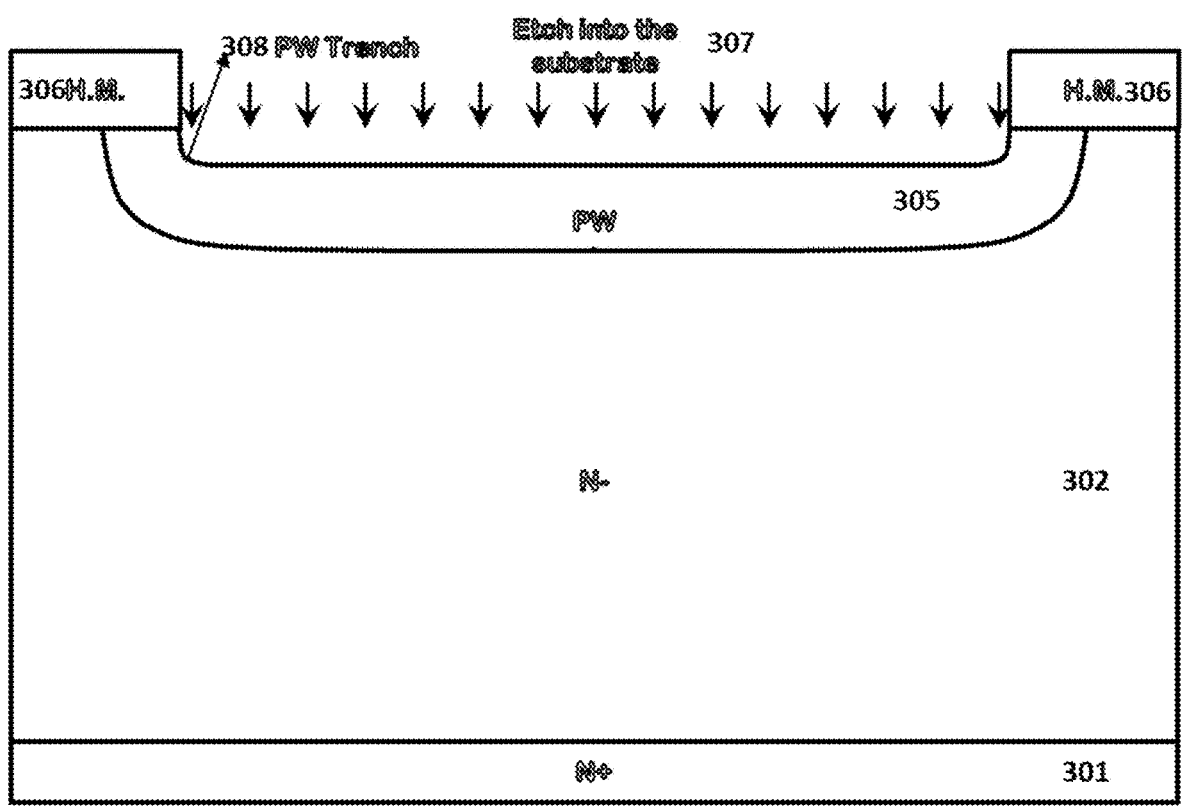
Figure 3H:
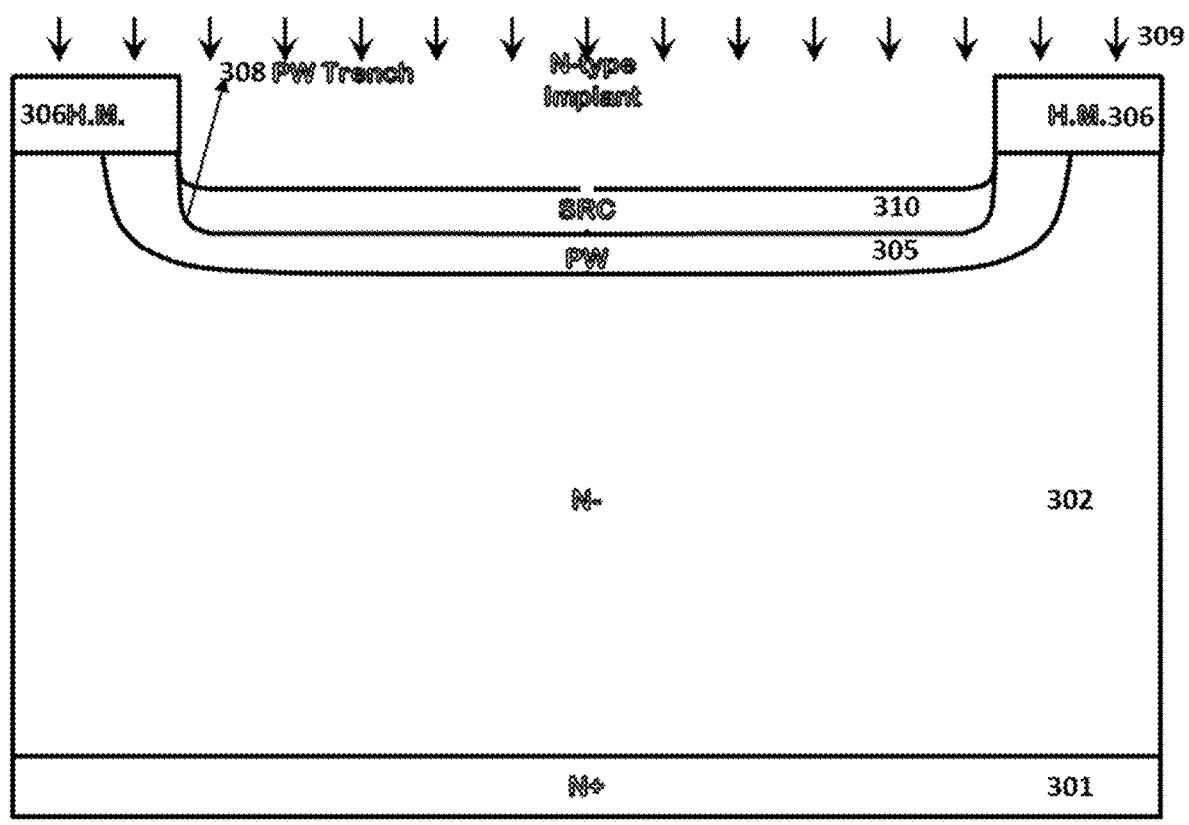
Figure 3I:
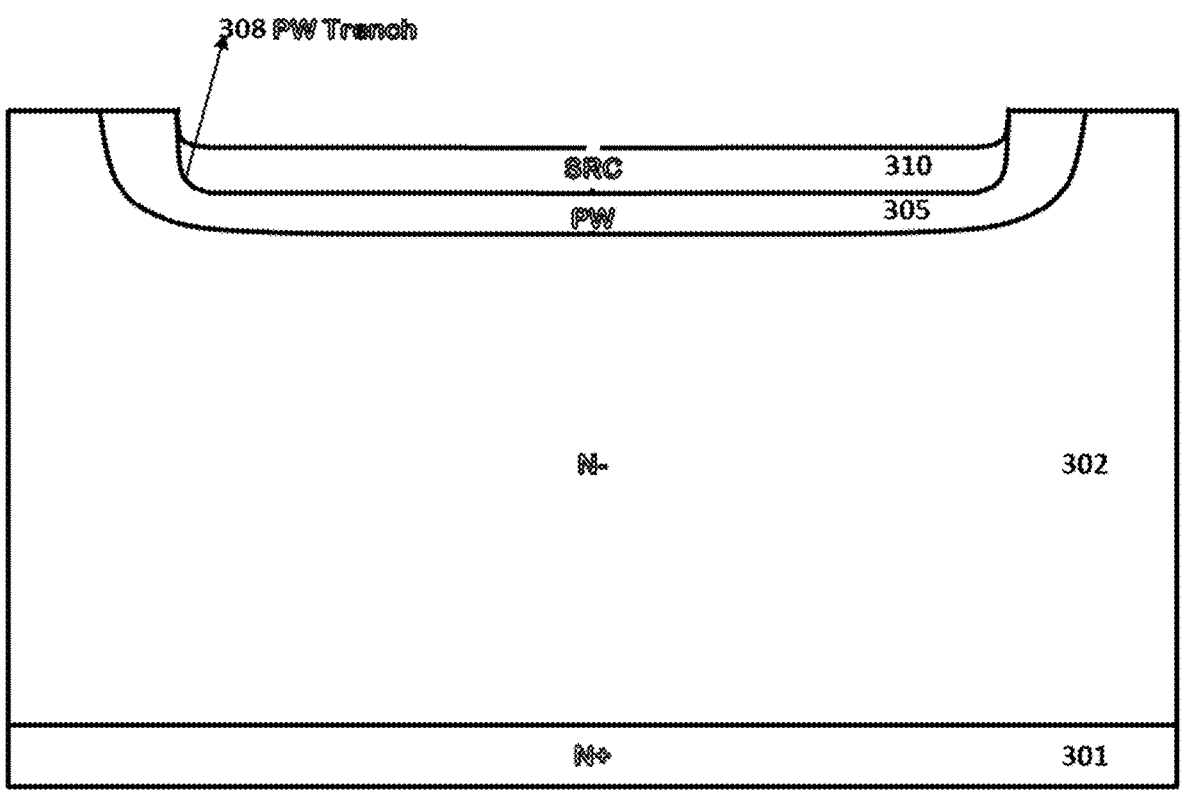
Figure 3J:
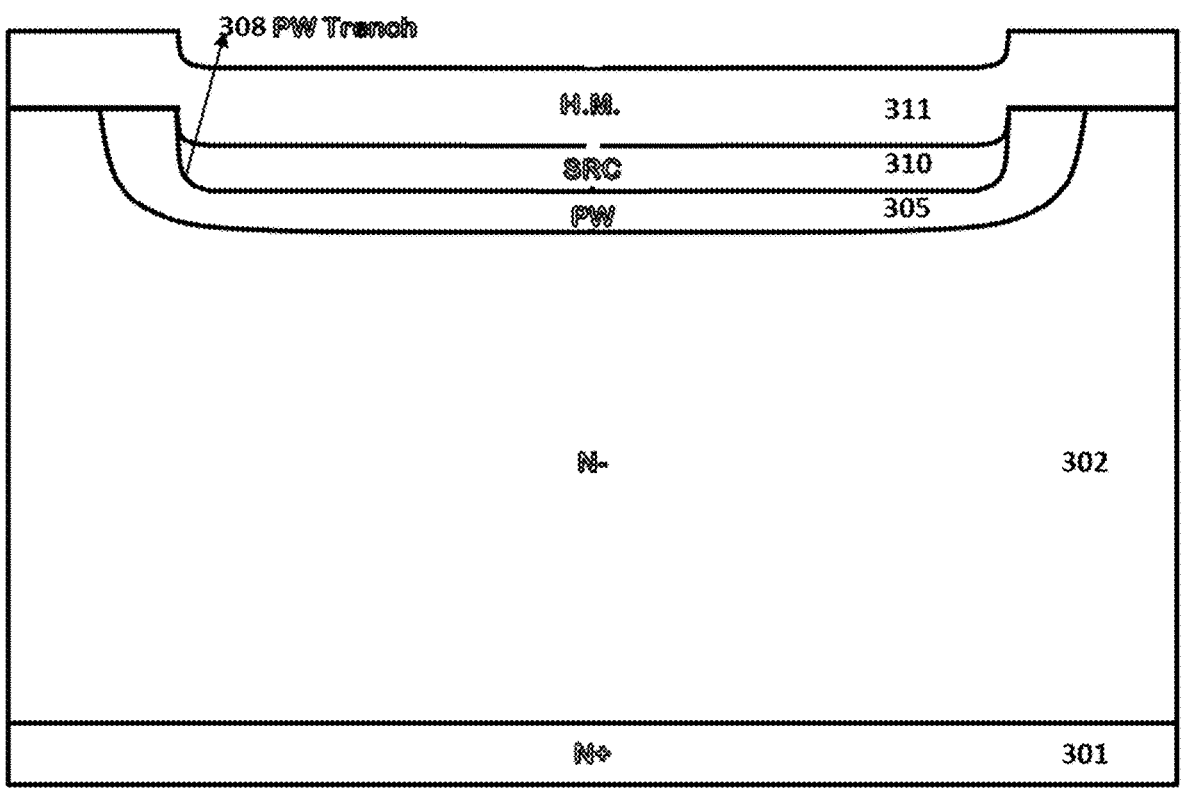
Figure 3K:
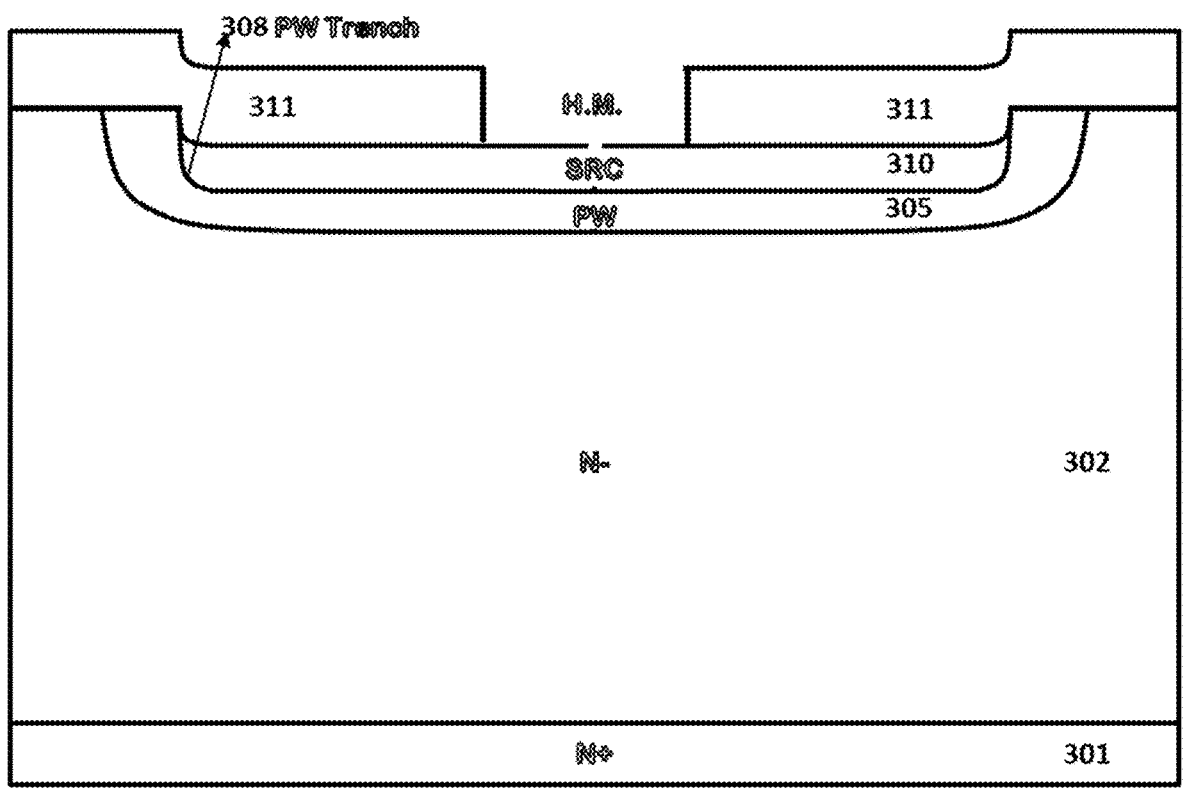
Figure 3L:
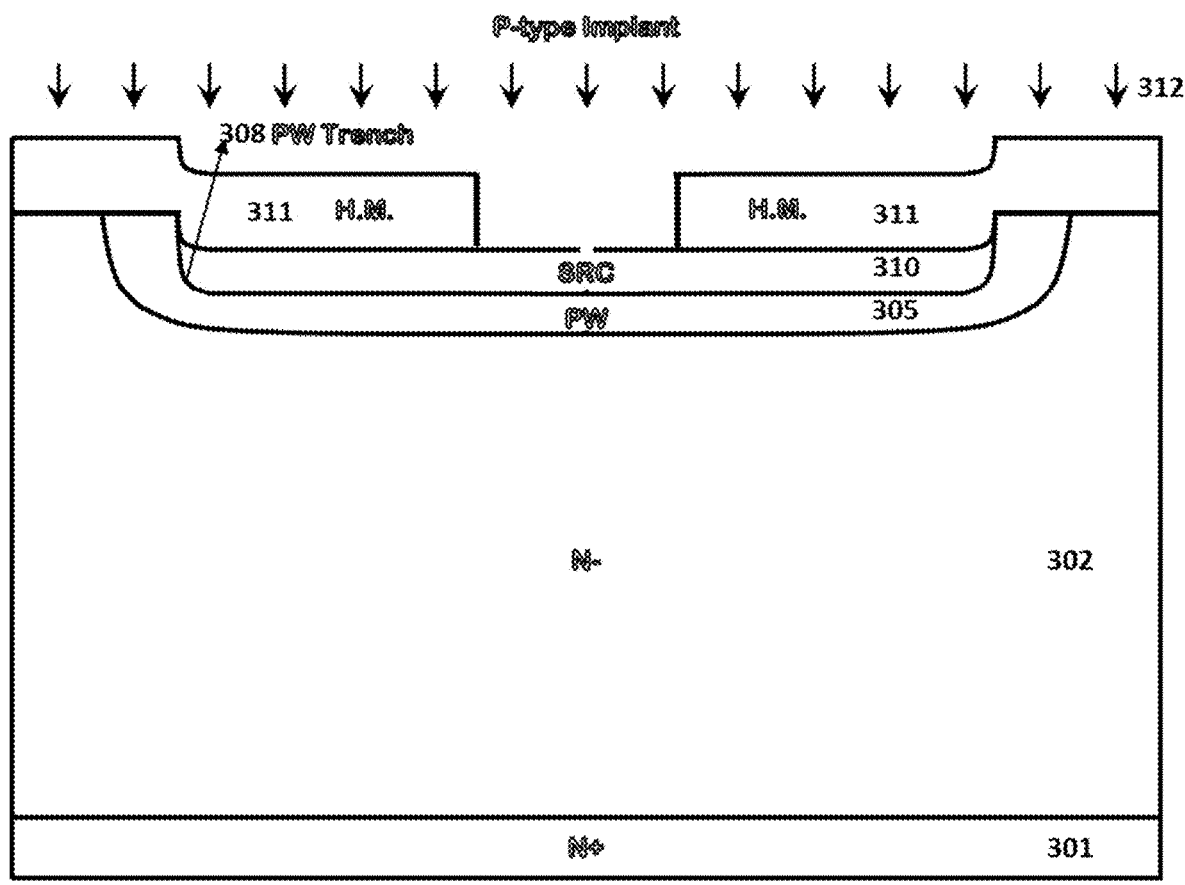
Figure 3M:
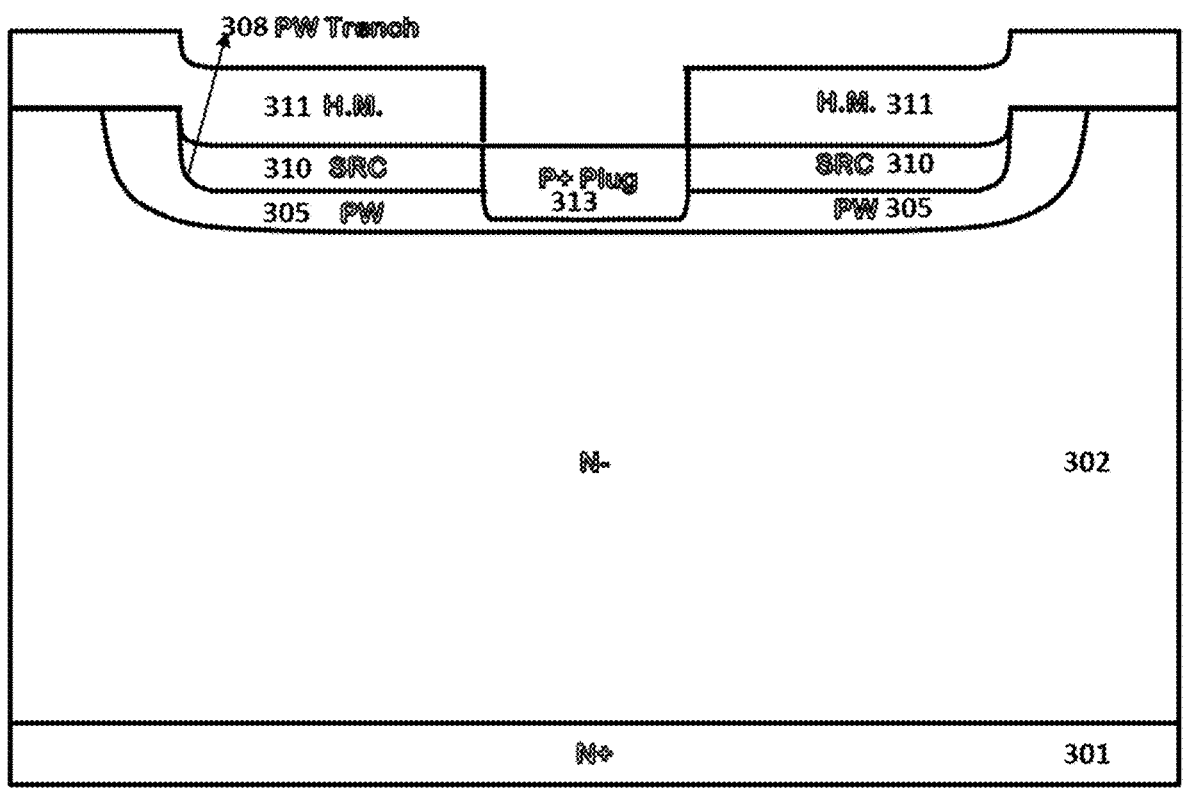
Figure 3N:
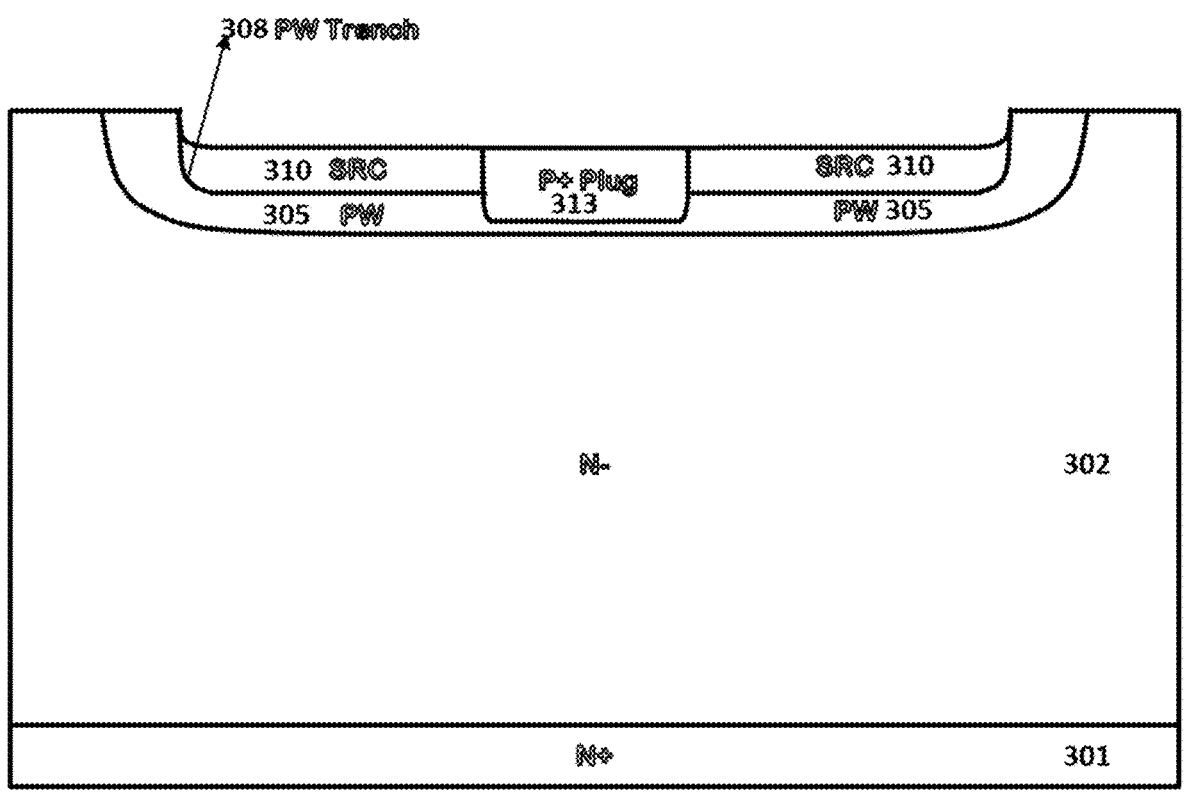
Figure 3O:
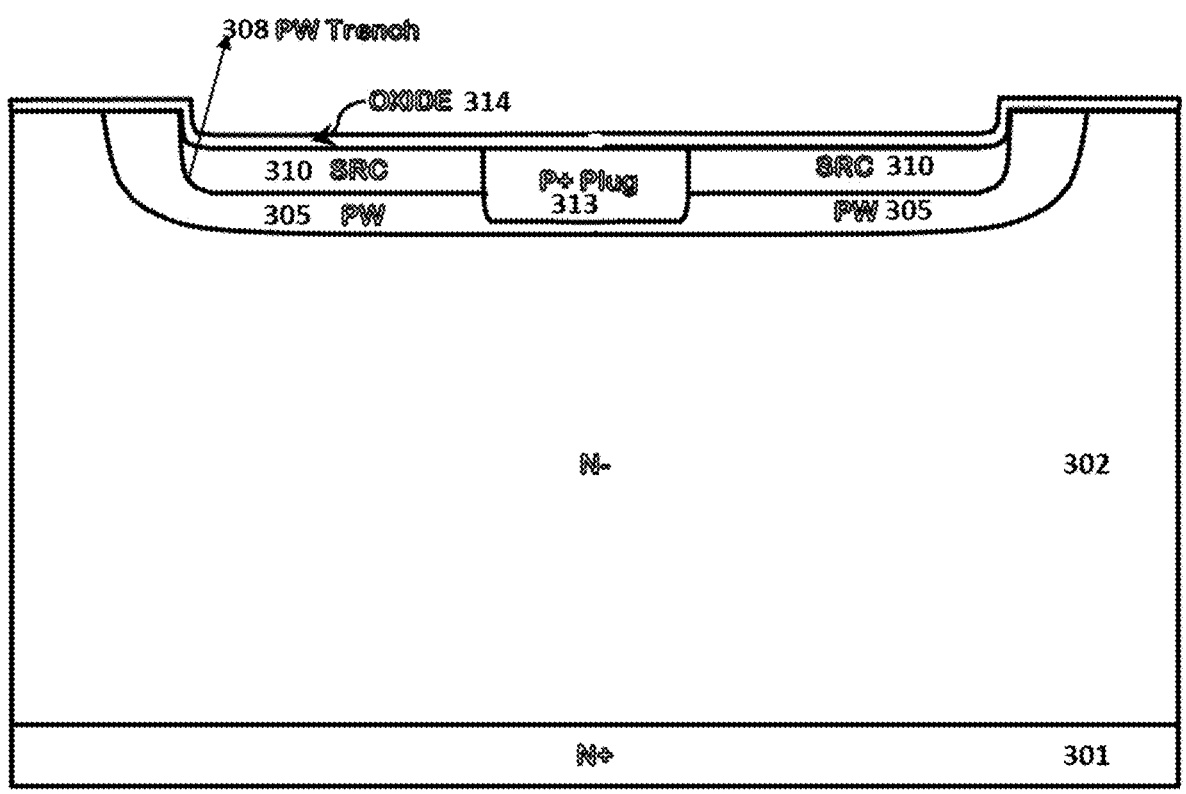
Figure 3P:
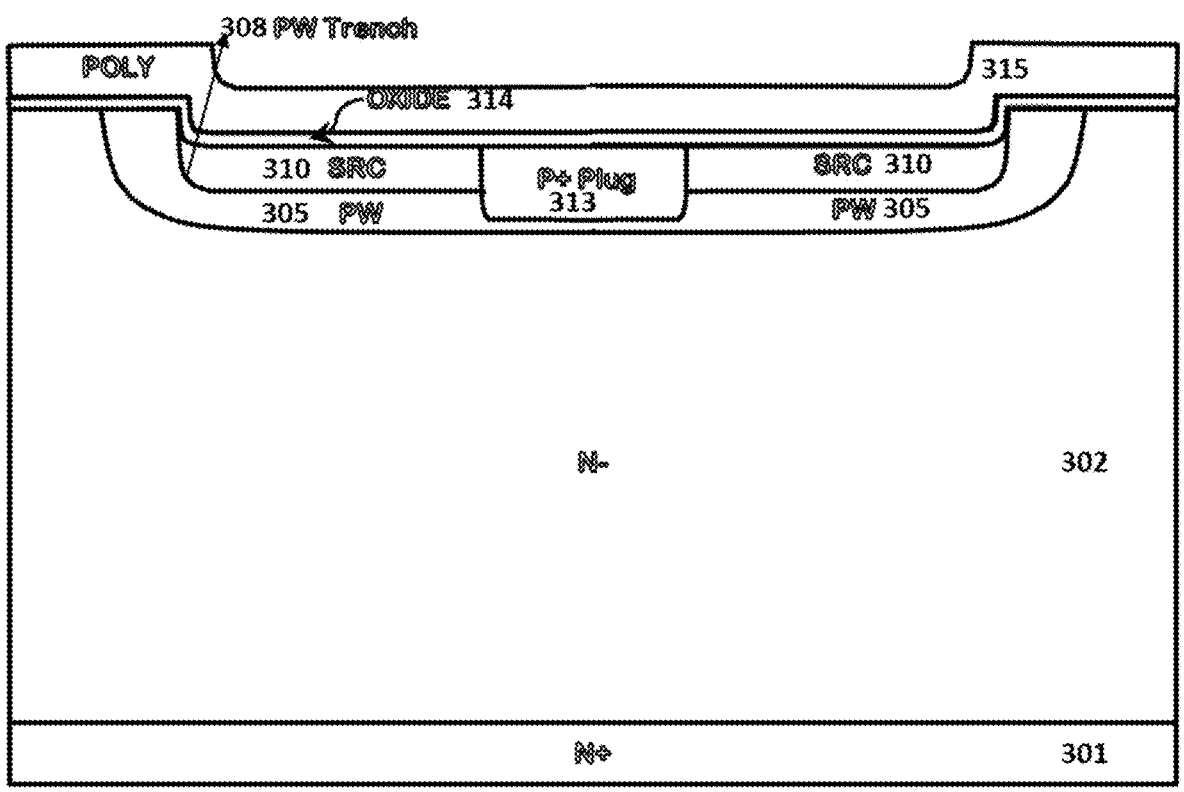
Figure 3Q:
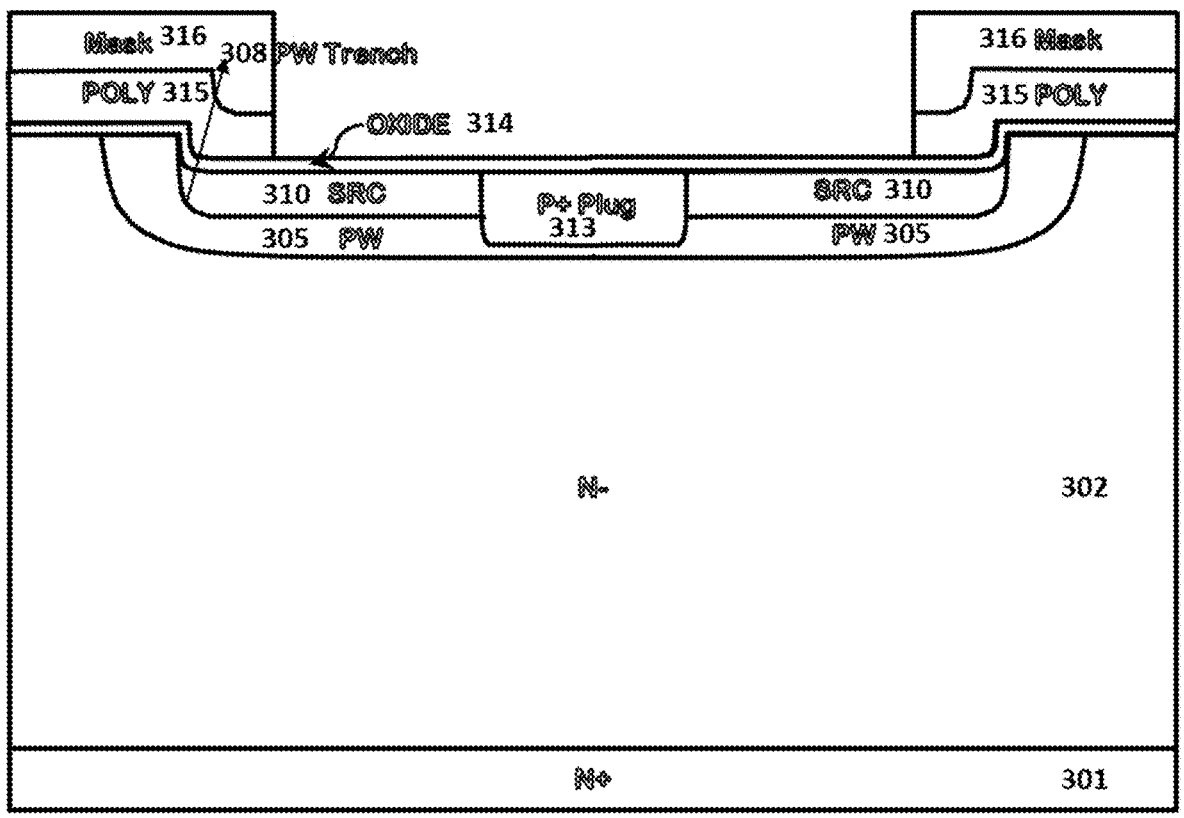
Figure 3R:
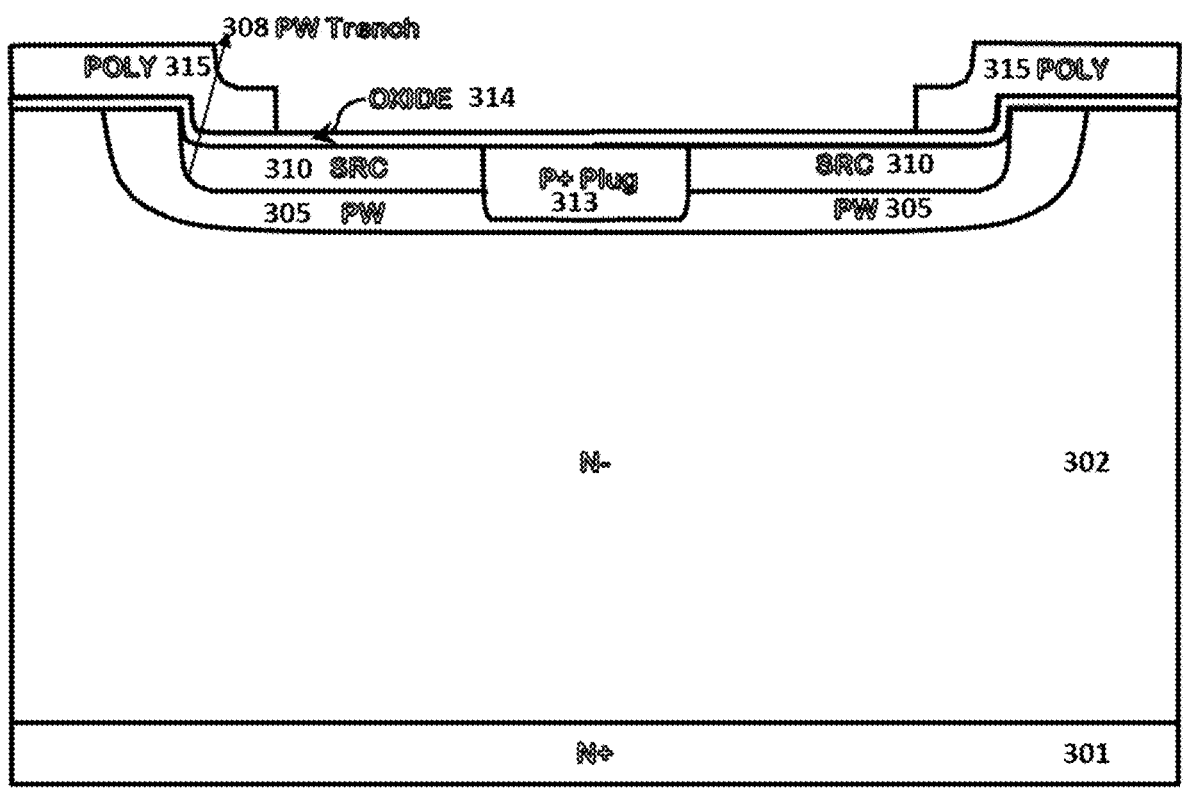
Figure 3S:
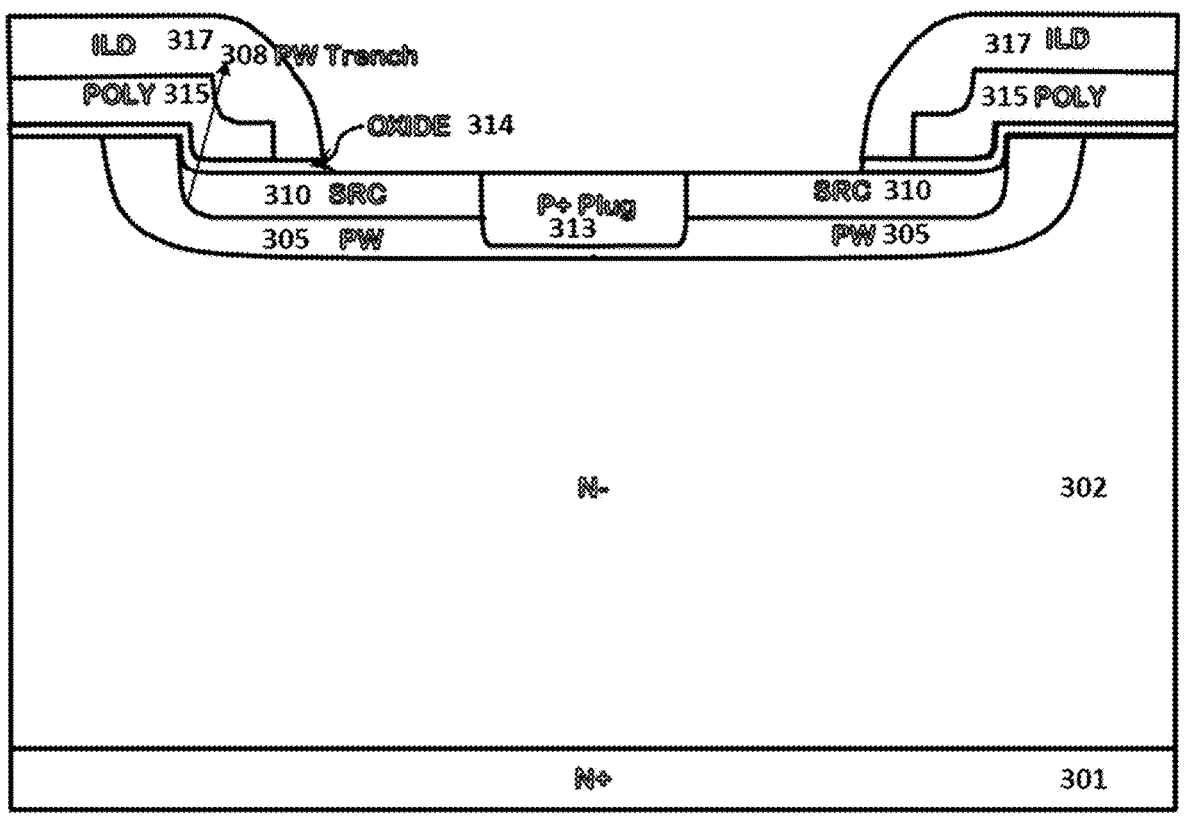
Figure 3T:
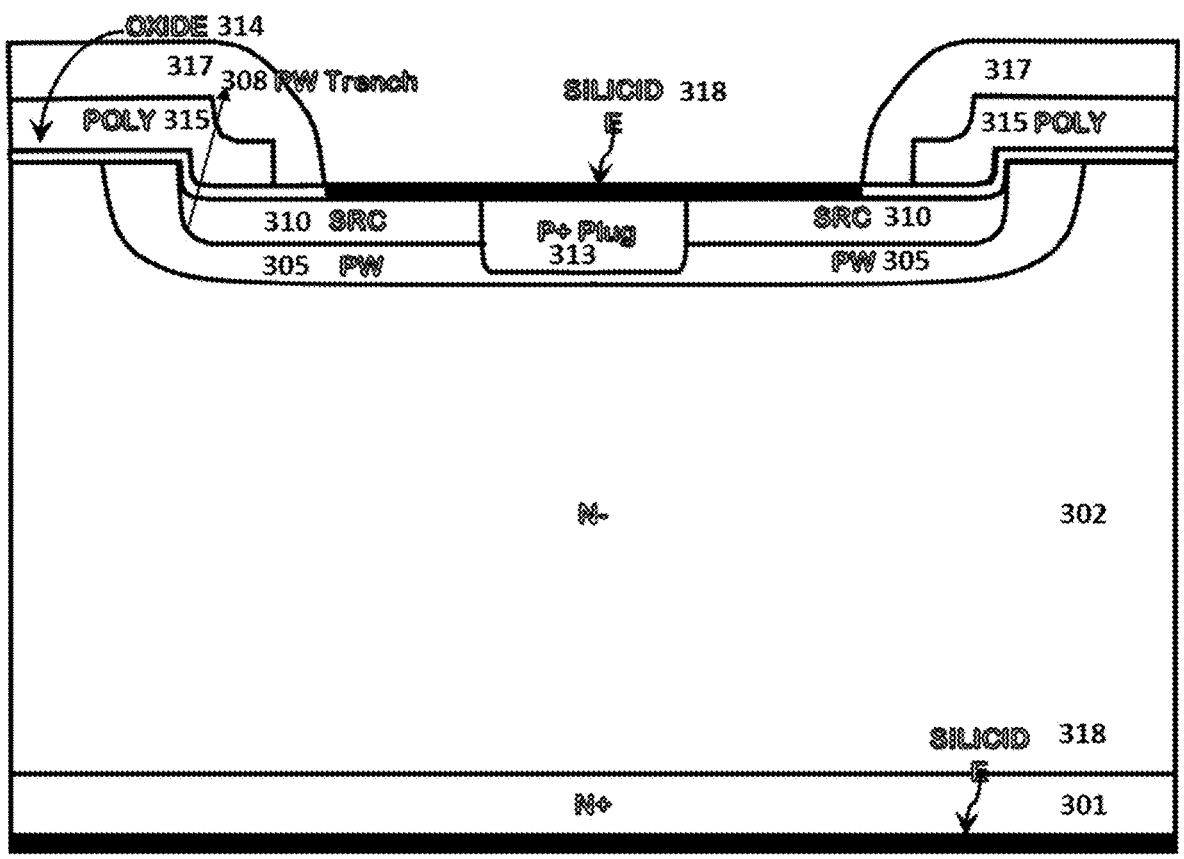
Figure 3U:
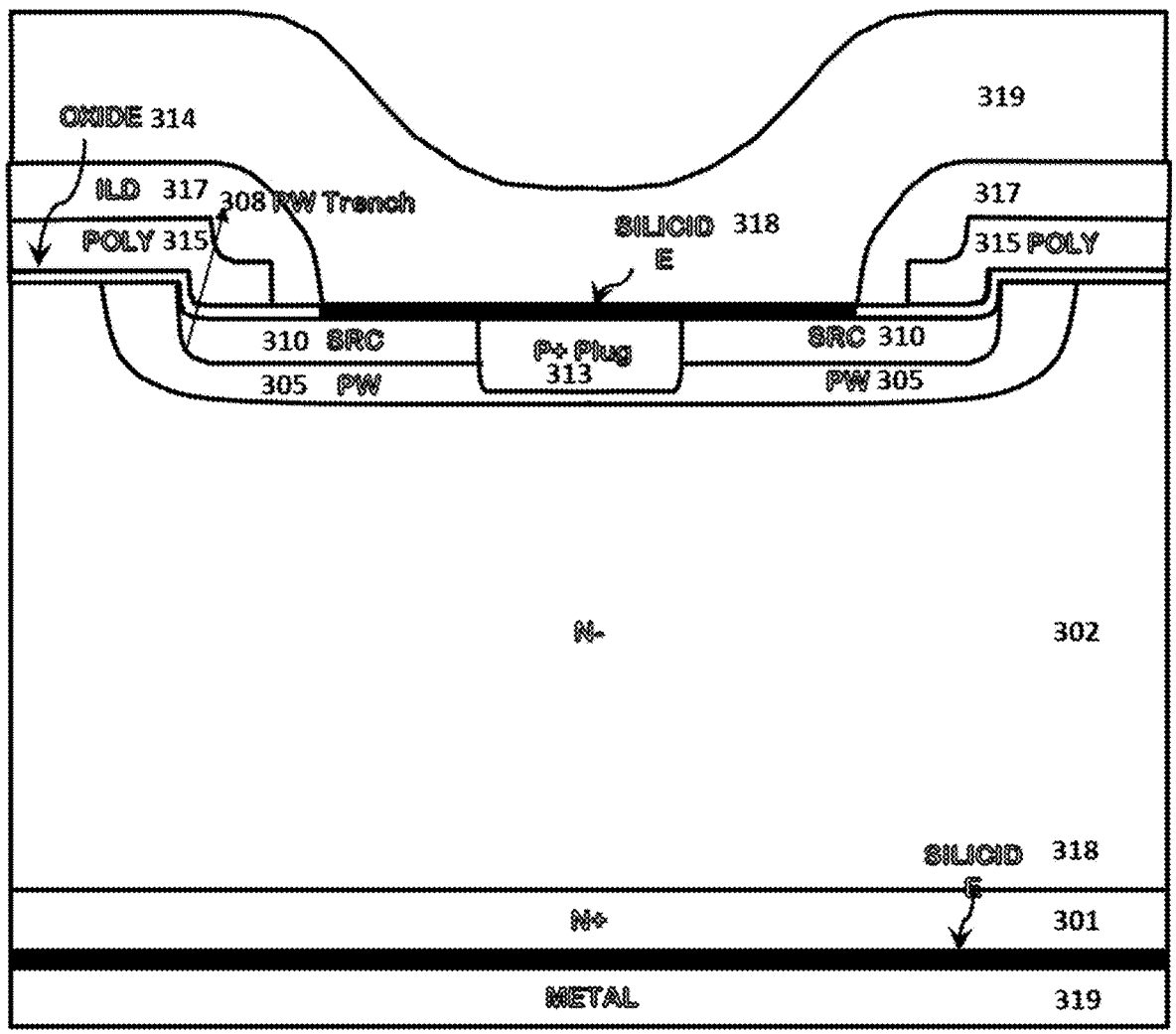
Figure 4:
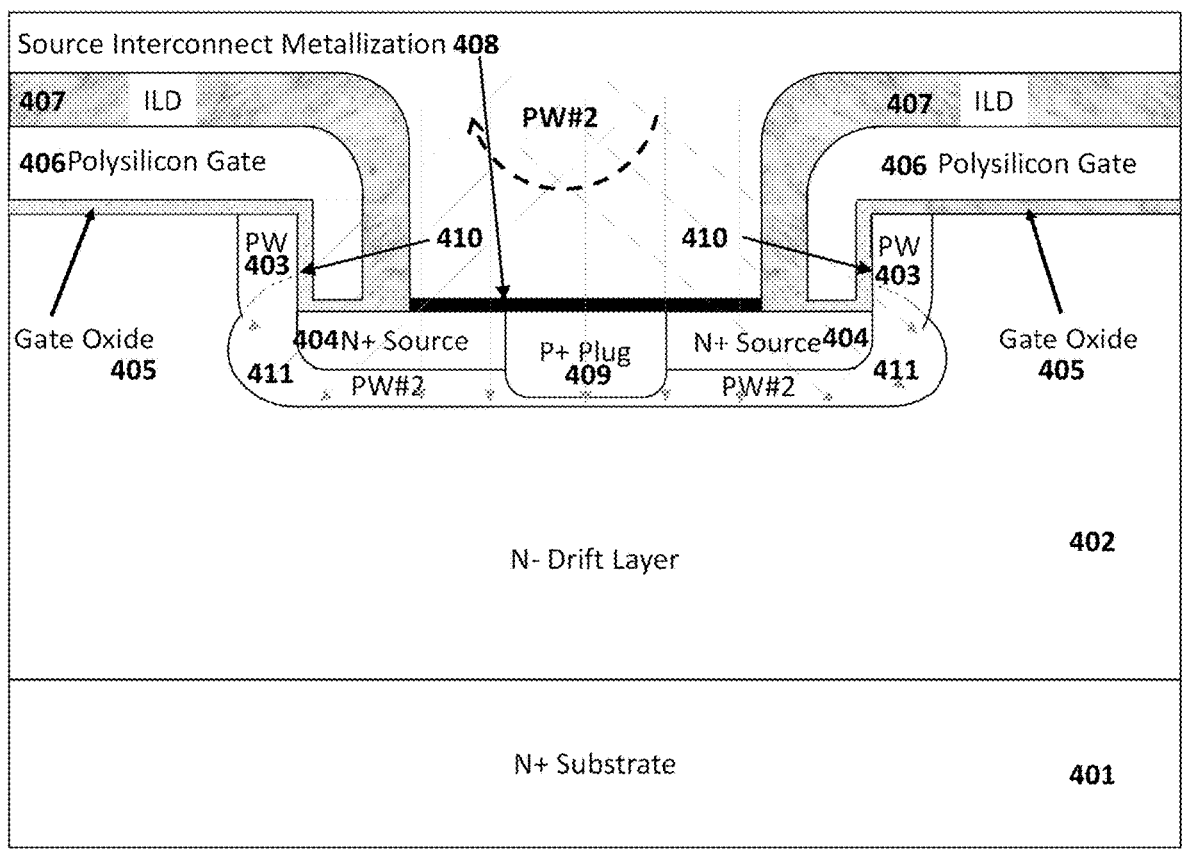
FIG. 4 shows an embodiment of a SiC DMOSFET with a portion of the MOS channel on (1000) and a second portion on (11-20) or (11-00) crystal planes and a deeper p-well trench and formation of a second p-well region under the N+ source region

FIG. 3a to FIG. 3u describes the process of manufacturing the structure shown in FIG. 2. The manufacturing process for a SiC DMOSFET is on a SiC substrate 301 and starts with using a 4H-SiC Si-face epi-wafer with suitable doping ($10^{14}$-$10^{18}$ cm$^{-3}$) and thickness (1 µm to 300 µm) for the epilayer 302 shown in FIG. 3a. A blanket hard mask 303 comprising a CVD deposited layer of silicon dioxide, silicon nitride, silicon oxynitride, or a metallic layer such as nickel, with thickness ranging from 50 nm to 5 µm is deposited in FIG. 3b and then patterned using photolithography followed by a dry etch using RIE for example as shown in FIG. 3c. Then p-well region is first formed by ion-implantation or epitaxial growth using aluminum or boron as the p-type impurity. A p-type implantation 304 comprising of boron or aluminum, at energies ranging from 10 keV to 800 keV, at implant doses ranging from $10^{12}$ cm$^{-2}$ to $10^{15}$ cm$^{-2}$ in FIG. 3d is performed to create a p-well 305 in FIG. 3e. The mask 303 is removed, and another hard mask layer 306 is deposited by a CVD deposited layer of silicon dioxide, silicon nitride, silicon oxynitride, or a metallic layer such as nickel, with thickness ranging from 50 nm to 5 µm and then patterned as in FIG. 3f. A p-well trench 308 is formed by controlled etching process 307 into the p-well region by RIE or ICP etching using the appropriately patterned hard mask layer 306 in FIG. 3g. The p-well trench 308 is formed with a sidewall angle between 70° and 90°. The depth of the p-well trench region ranges from 0.1 µm to 0.5 µm. The depth of the p-well trench may be adjusted to be shallower than the depth of the p-well region 305. The bottom of the p-well trench 308 may be enclosed within the p-well region 305. A n-type implant 309 is done for creating a N+ source region 310 in FIG. 3h. A N+ source region is formed by ion-implantation or by epitaxial re-growth by a n-type impurity such as nitrogen or phosphorus. The same hard mask layer 306 used for etching the p-well trench may be advantageously used for patterning the N+ source implant so the source implant is perfectly aligned under the p-well trench. The masking layer 306 is removed in FIG. 3i. Another hard mask layer 311 is deposited in FIG. 3j. The hard mask layer 311 is patterned in FIG. 3k. A P+ plug layer may be formed by implantation of a controlled dose of a p-type impurity 312 such as aluminum or boron in FIG. 3l. The depth of the P+ plug layer 313 may preferably exceed the depth of the N+ source implant and may even exceed the depth of the p-well region, in a particular implementation in FIG. 3m. This is followed by the removal of the hard mask 311 using either dry or wet etching techniques commonly practiced by those in the field in FIG. 3n. Then the oxide layer 314 which is the gate oxide is formed by thermal oxidation or using CVD of a dielectric layer such as silicon dioxide, silicon nitride, silicon oxynitride, etc in FIG. 3o. The thickness of the gate oxide could range from 10 nm to 100 nm. Either dry or wet thermal oxidation could be used for oxide growth. Plasma-enhanced chemical vapor deposition (PECVD) or low-pressure chemical vapor deposition (LPCVD) could be used for gate oxide deposition. A polysilicon gate layer 315 is then deposited in FIG. 3p. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. A hard mask 316 is deposited on top and patterned as shown in FIG. 3q. The polysilicon gate layer 315 is etched by using the patterned mask layer 316. The mask layer 316 is then removed in FIG. 3r. An ILD layer 317 comprising of 50 nm-1000 nm thick silicon dioxide, silicon nitride, silicon oxynitride layers or a stacked combination thereof is deposited on the wafer; a hard mask is deposited and patterned on top to define the ILD opening; the ILD layer 317 is patterned using the hard mask as shown in FIG. 3s. Further the gate oxide 314 is etched using the same mask. The mask is then removed and a nickel silicide region 318 is formed on the exposed SiC surface in FIG. 3t. Interconnect metal layers 319 of either aluminum or silver or gold is deposited and patterned on the top and bottom of the chip in. FIG. 3u An embodiment shown in FIG. 4 is the unit cell of a cross-sectional structure of a SiC DMOSFET. The key regions of this device are a p-well region 403, which is formed by ion-implantation or epitaxial re-growth of a p-type species such as aluminum or boron. There is an N+ source region 404, N− drift layer 402, and an N+ substrate 401. In the ON state when a gate voltage is applied to the polysilicon gate 406, the current flows vertically from the drain 401, through the inversion layer which is formed at the top of the p-well layer 403, through the N+ source region 404, and out through the source metallization 408. In the OFF state or the blocking state, a voltage is supported across the p-well 403, N− drift layer 402 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide 405. Another feature is an ILD layer 407 which is used to insulate the source interconnect metallization 408 from the polysilicon gate 406. At the very center of the unit cell, there is a P+ plug layer 409 which is grounded with the N+ source metallization. The purpose of the P+ plug in SiC DMOSFET is to ground the p-well region with the N+ source contact.

A p-well trench 410 is formed by dry etching into the p-well implanted region immediately preceding the source region 404 formation, resulting in a portion of the MOS channel that is formed on the (0001) or horizontal face and another portion of the MOS channel that is formed on the (11-20/10-10) or vertical crystal plane of SiC. However, in the embodiment shown in FIG. 4, a much deeper vertical MOS channel is formed by etching all the way through the p-well region. Subsequently, after the formation of the N+ source region, a second p-well region indicated as PW #2 411 is ion-implanted under and around the N+ source region in order to suppress reach-through breakdown.

The p-well region 403 is first formed by ion-implantation or epitaxial growth using aluminum or boron as the p-type impurity. Then, a p-well trench 410 is formed by controlled etching into the p-well region by RIE or ICP etching using an appropriately patterned hard mask layer. The p-well trench 410 may be formed with a sidewall angle between 75° and 90°. The depth of the p-well trench region may range from 0.5 µm to 2 µm. Compared to the device shown in FIG. 2 the device in FIG. 4 has the depth of the p-well trench which may be adjusted to be of the same depth or even slightly deeper than the p-well region. The bottom of the p-well trench in the embodiment shown in FIG. 4 may not be completely enclosed within the p-well region. A N+ source region is then formed by ion-implantation or by epitaxial re-growth by a n-type impurity such as nitrogen or phosphorus. A second p-well region (PW #2) 411 is then formed to a sufficient depth under the N+ source region, such that the lateral extent of the PW #2 region is larger than that of the original p-well region. Two methods for forming the PW #2 411 regions are identified. (1) A dedicated hard mask layer may be deposited and patterned with a slightly larger extent than the original p-well region, and then the ion-implantation for PW #2 may be performed. (2) Tilted ion-implantation may be advantageously used for realizing PW #2. In the embodiment here, the same hard mask may be used for creating the trench, N+ source region and then the PW #2 region, whose lateral extent is made larger than the original p-well region 403 using tilted ion-implantation of a p-type impurity. The remainder of the process constitutes heat treatment of the wafers for electrical activation of the implanted impurities, gate insulator formation, gate electrode formation, inter-level dielectric formation, source/drain ohmic metallization and finally the formation of pad or interconnect metals compatible with die probing and packaging. The gate insulator 405 is formed either by thermal oxidation of the silicon carbide or by CVD of a dielectric layer such as silicon dioxide, silicon nitride, silicon oxynitride, etc.

The device described in this embodiment in FIG. 4 is an enhancement to the device described in the embodiment in FIG. 2 and has several additional functions and advantages. The vertical portion of the MOS channel of the embodiment in FIG. 4 can be made much larger than the device shown in FIG. 2, due to a deeper p-well trench 410 for the MOSFET in FIG. 4. A larger percentage of the MOS channel can be realized on the higher channel mobility capable vertical sidewall as compared to the horizontal surface. For example, for a total channel length of 1 µm, 0.25 µm of the MOS channel can be realized on the horizontal surface and 0.75 µm of the MOS channel can be realized on the vertical sidewall. Thus, the effective channel mobility of the device described in embodiment shown in FIG. 4 can be larger than the device described in embodiment shown in FIG. 2, for the same MOS channel length. Hence for the same effective channel mobility, a longer channel MOSFET can be fabricated using embodiment in FIG. 4 as compared to the MOSFET fabricated using embodiment in FIG. 2. A longer channel MOSFET offers higher device robustness, including lower drain saturation current, higher short-circuit robustness, lower Vth roll-off with drain voltage, immunity from drain induced barrier lowering (DIBL) effects.

In the embodiment in FIG. 4 a larger extent for the PW #2 411 as compared to the original p-well 403 is necessary and beneficial for reducing the channel length of the horizontal portion of the MOS channel. By forming a PW #2 with a larger lateral extent than the original p-well, the drain potential during the high-voltage blocking condition is effectively shielded from the original p-well region by the PW #2 region. This enables a significantly reduced lateral extent (electrical dose) for the original p-well region that extends beyond the p-well trench, without risk of reach-through breakdown. A reduced lateral extent for the p-well region beyond the p-well trench leads to a smaller portion of the MOSFET channel formed on the horizontal surface.

Figure 5A:
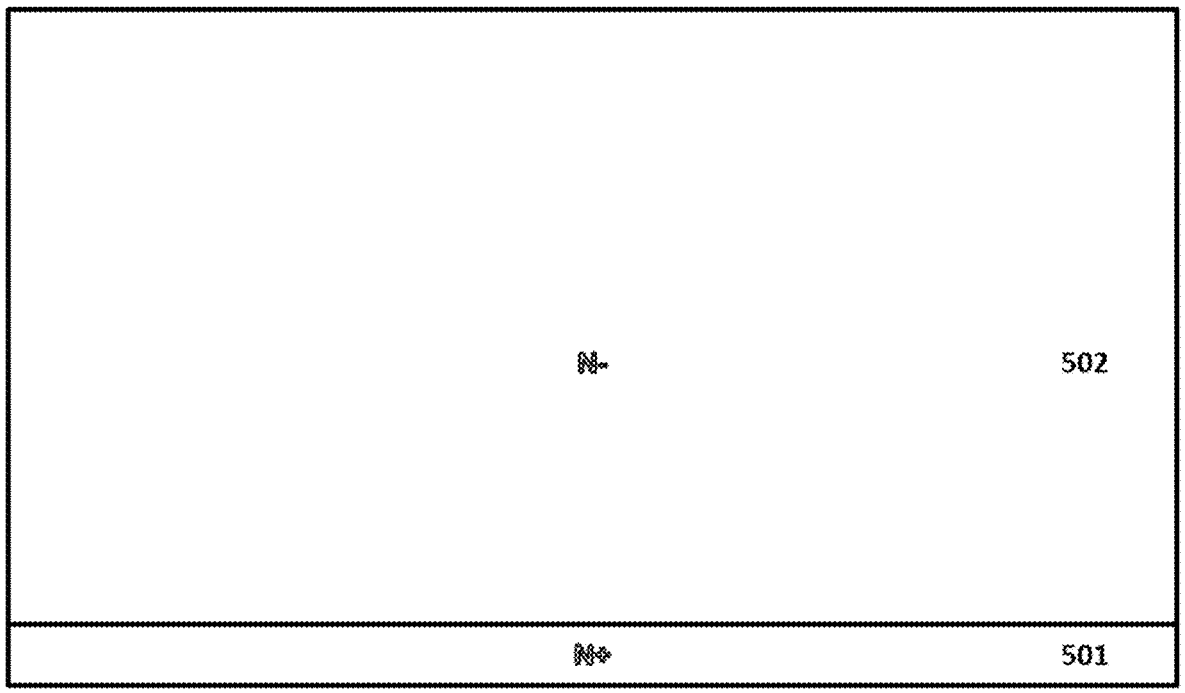
FIG. 5a to FIG. 5v are cross sectional views showing the process steps for manufacturing the SiC DMOSFET structure in FIG. 4.
Figure 5B:
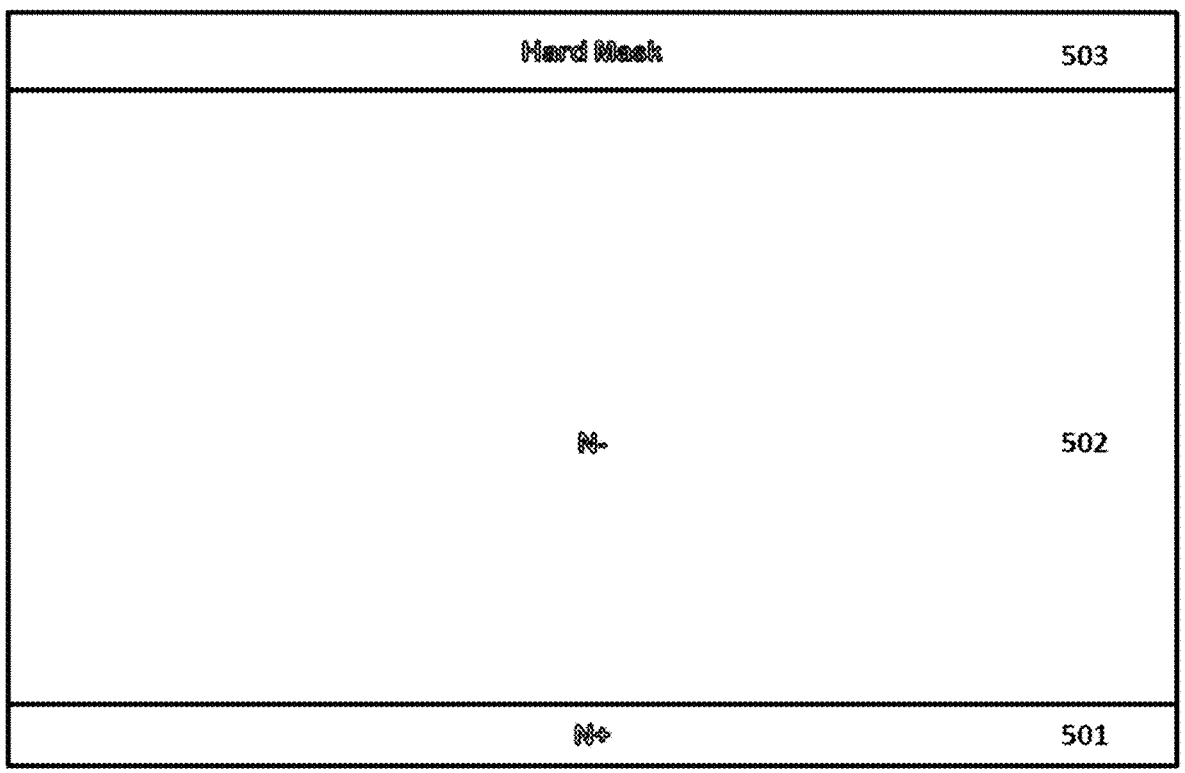
Figure 5C:
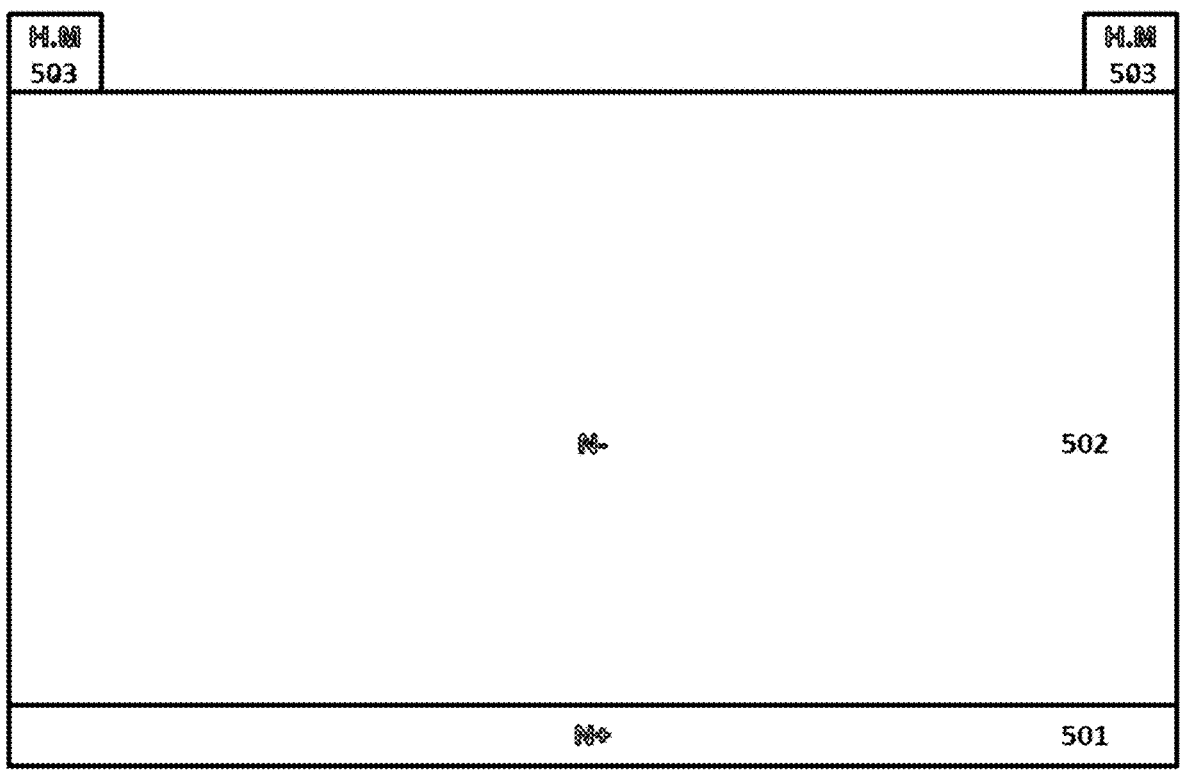
Figure 5D:
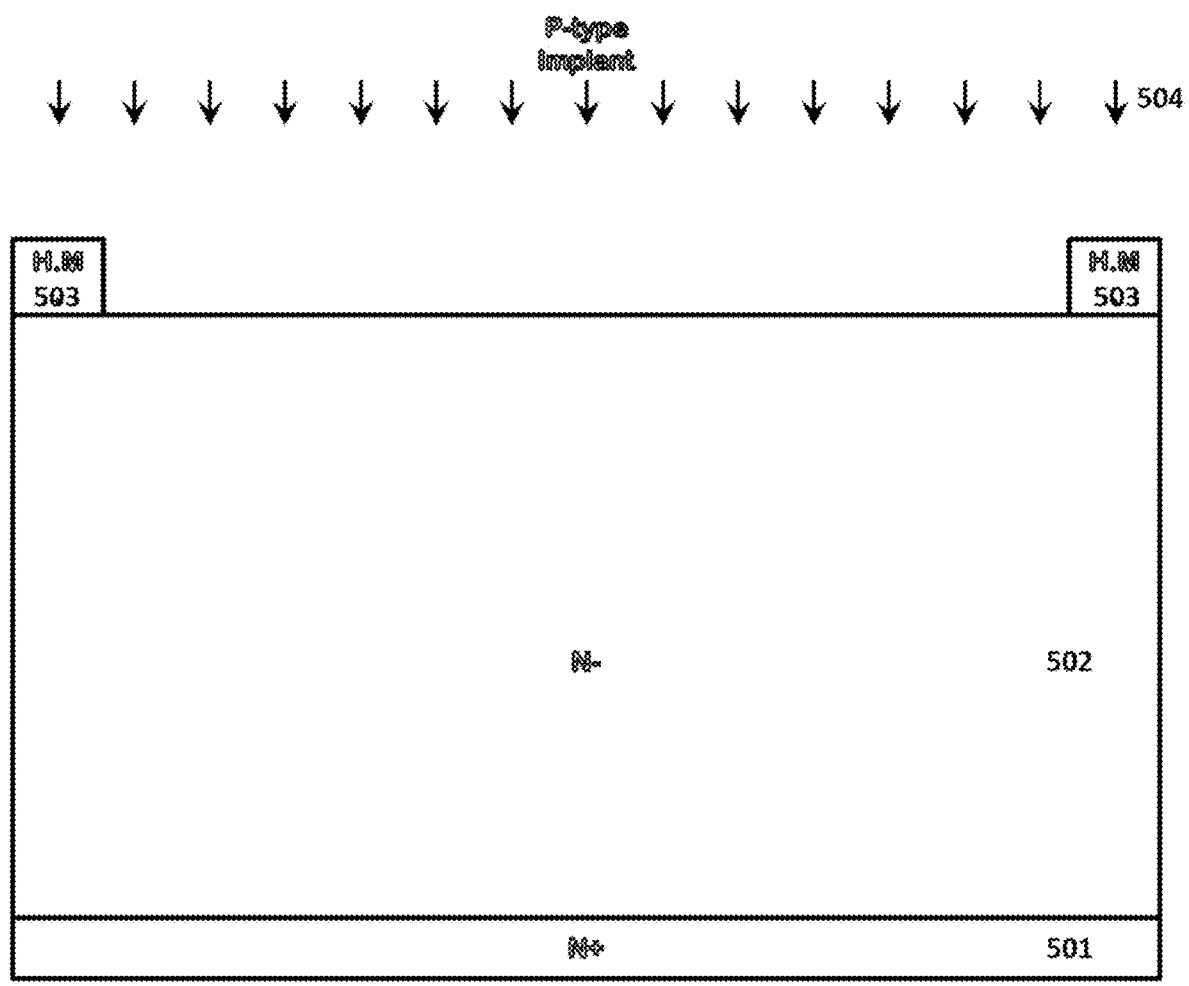
Figure 5E:
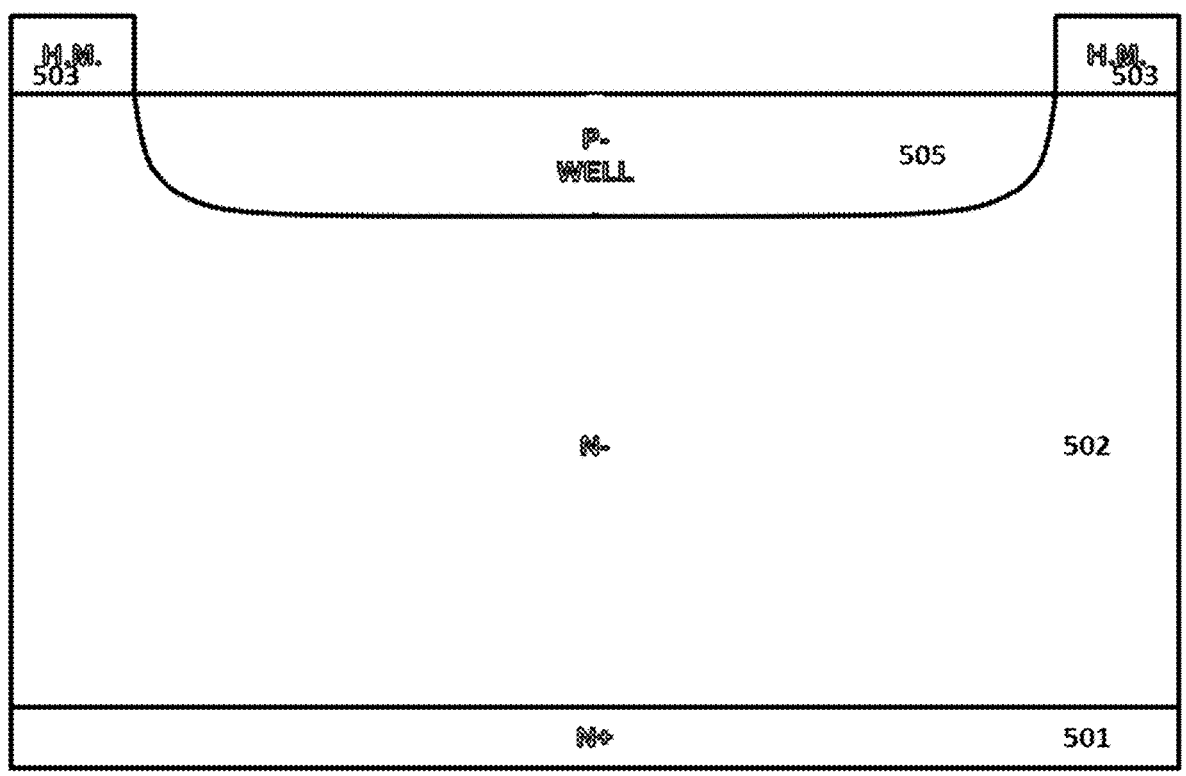
Figure 5F:
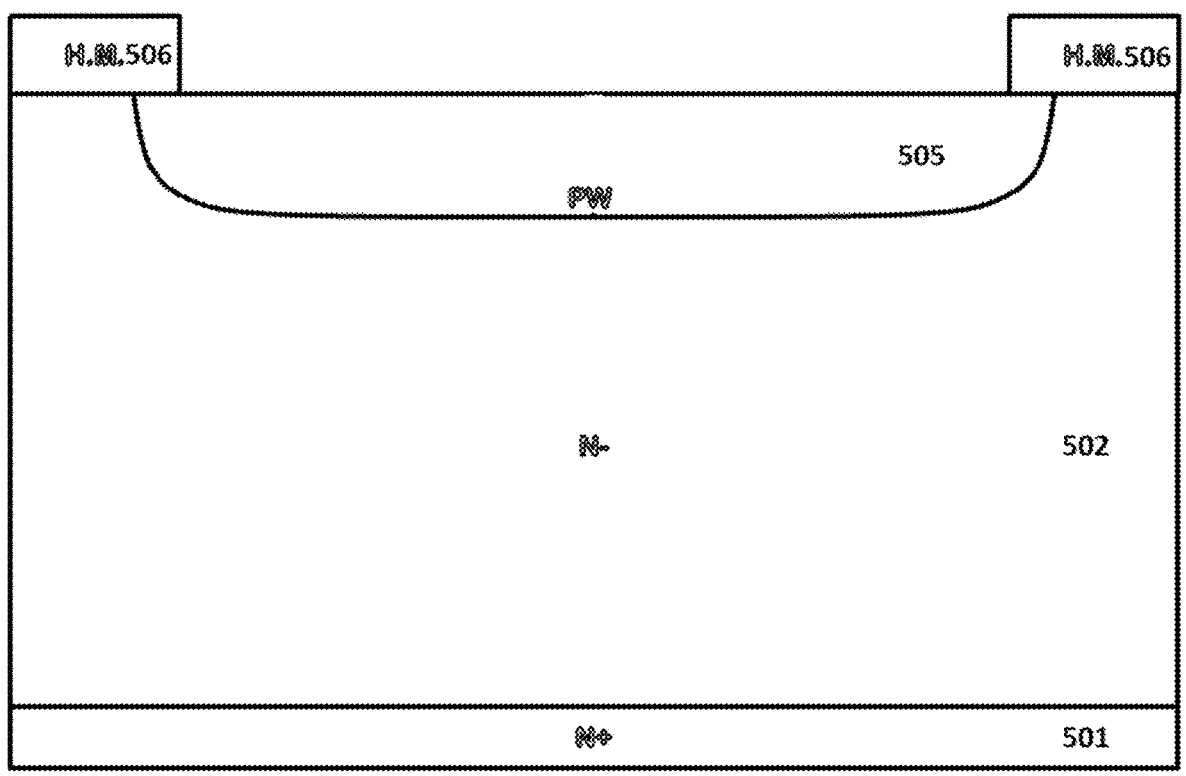
Figure 5G:
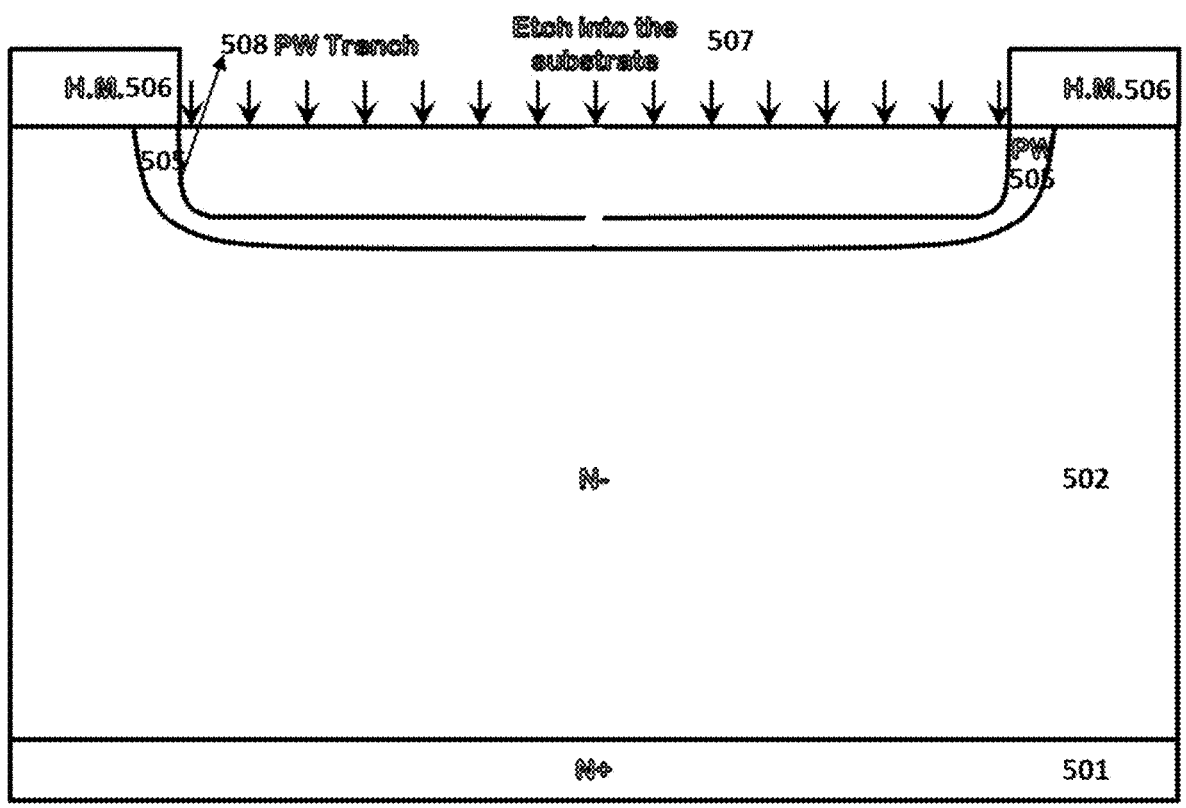
Figure 5H:
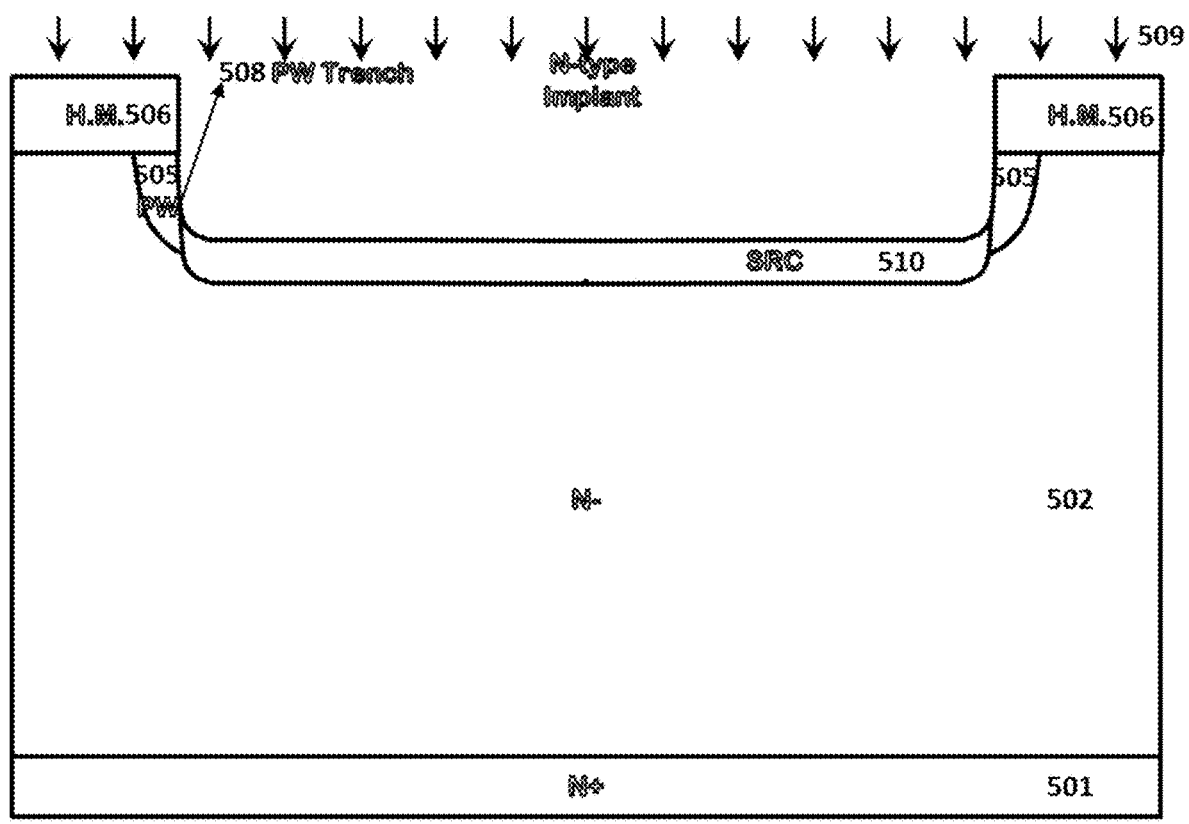
Figure 5I:
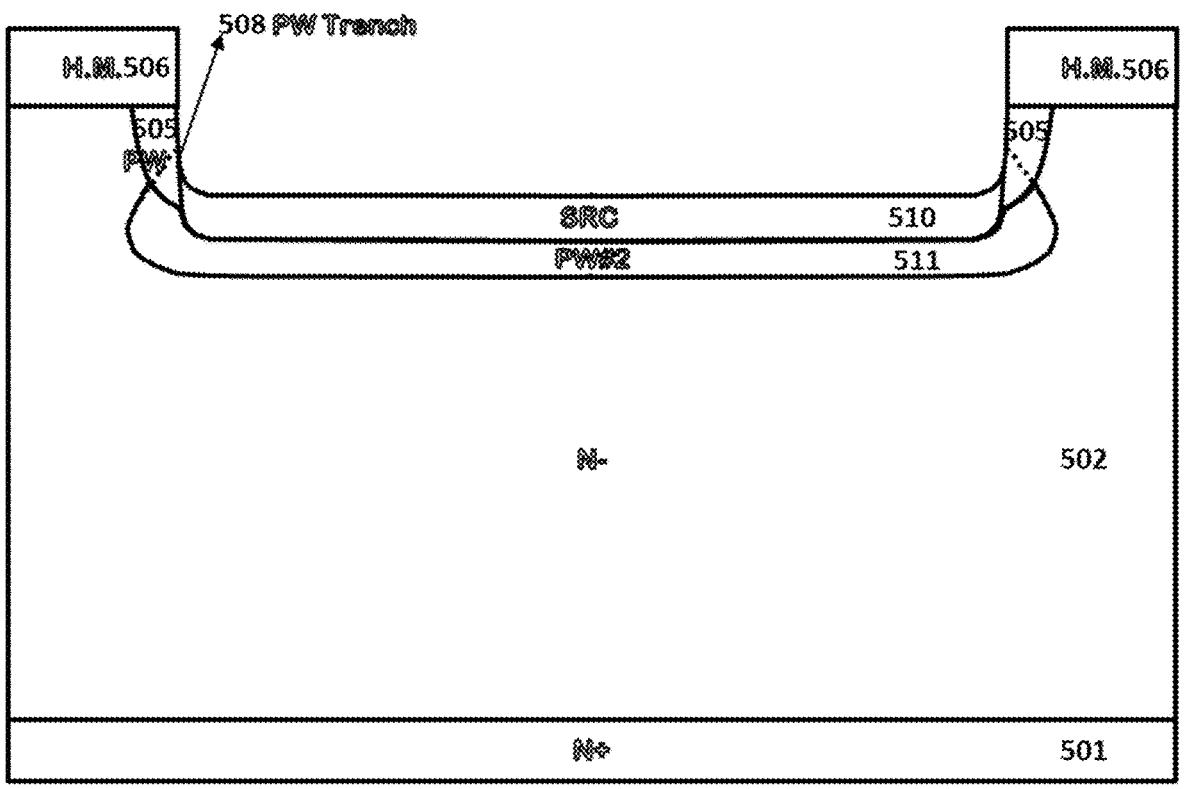
Figure 5J:
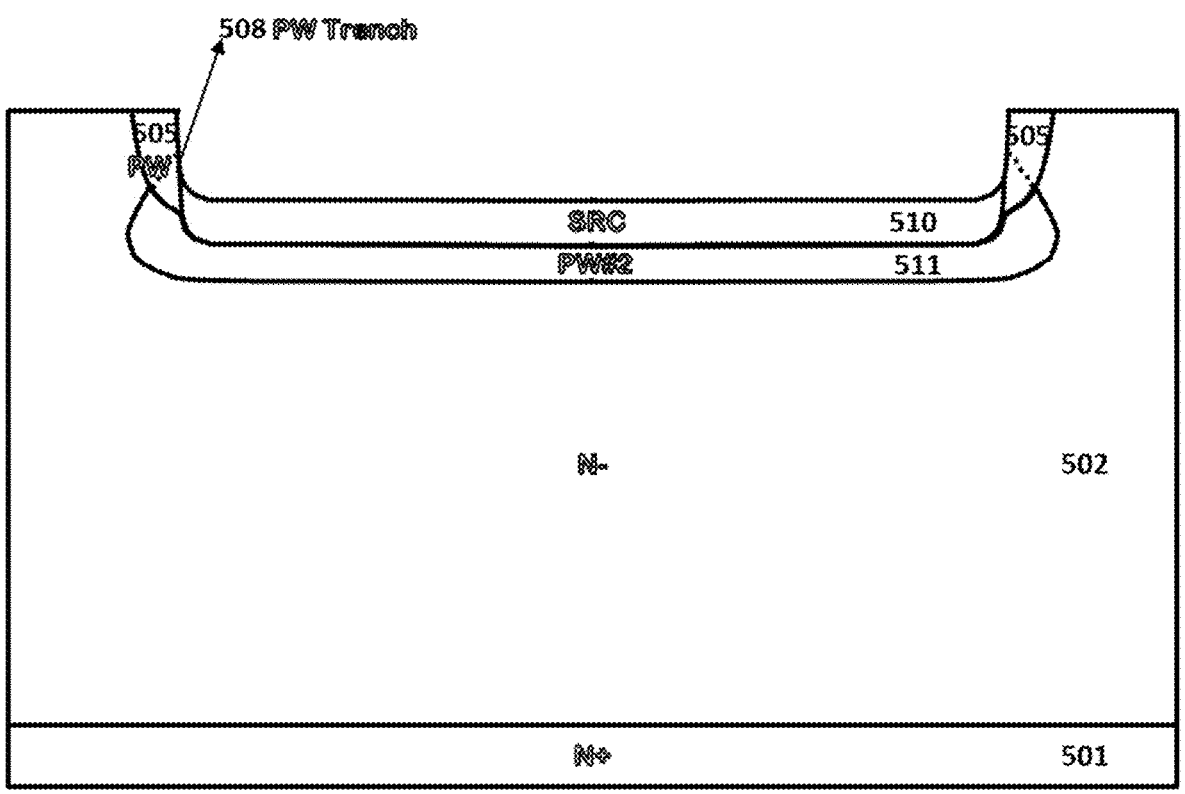
Figure 5K:
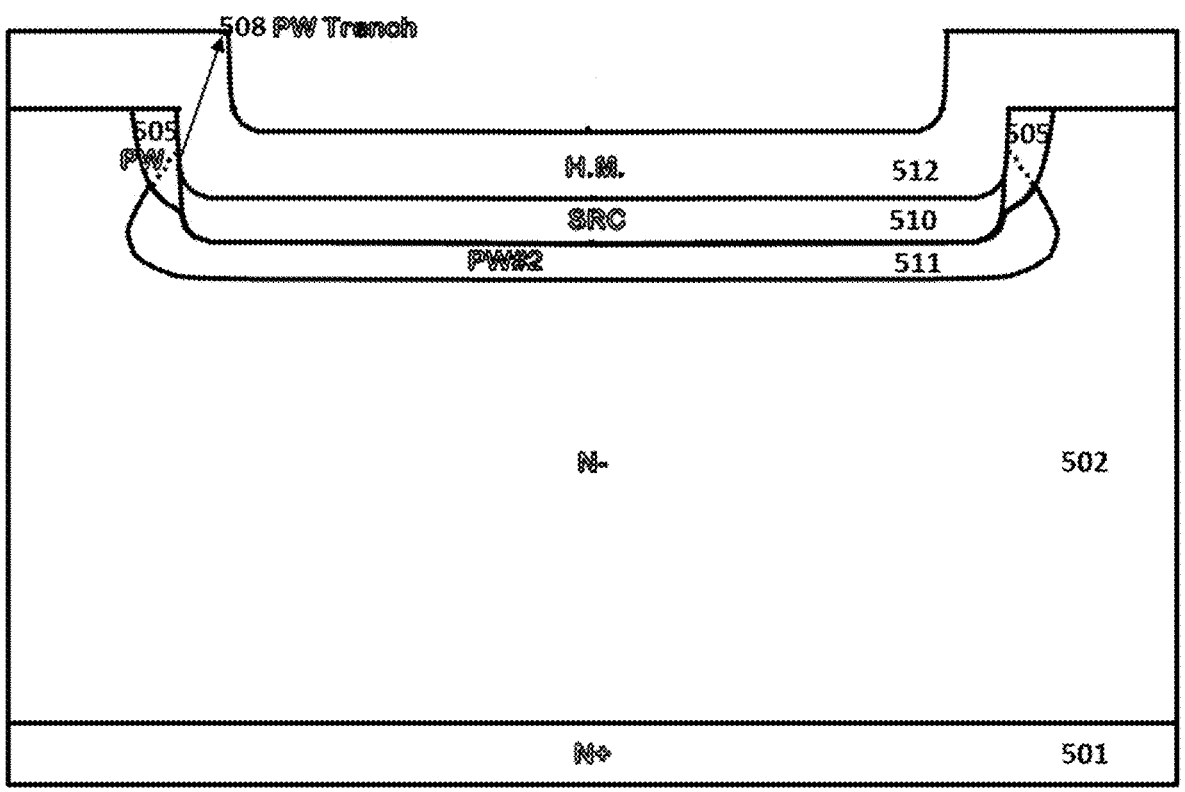
Figure 5L:
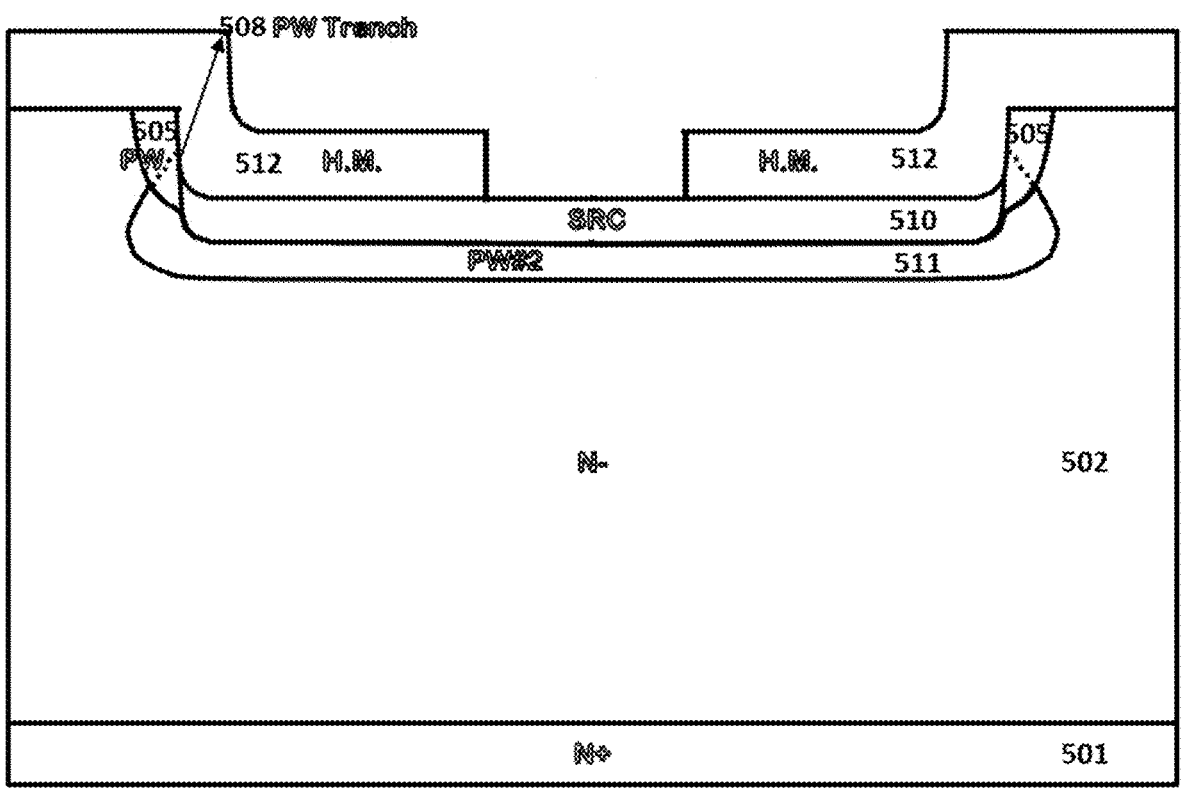
Figure 5M:
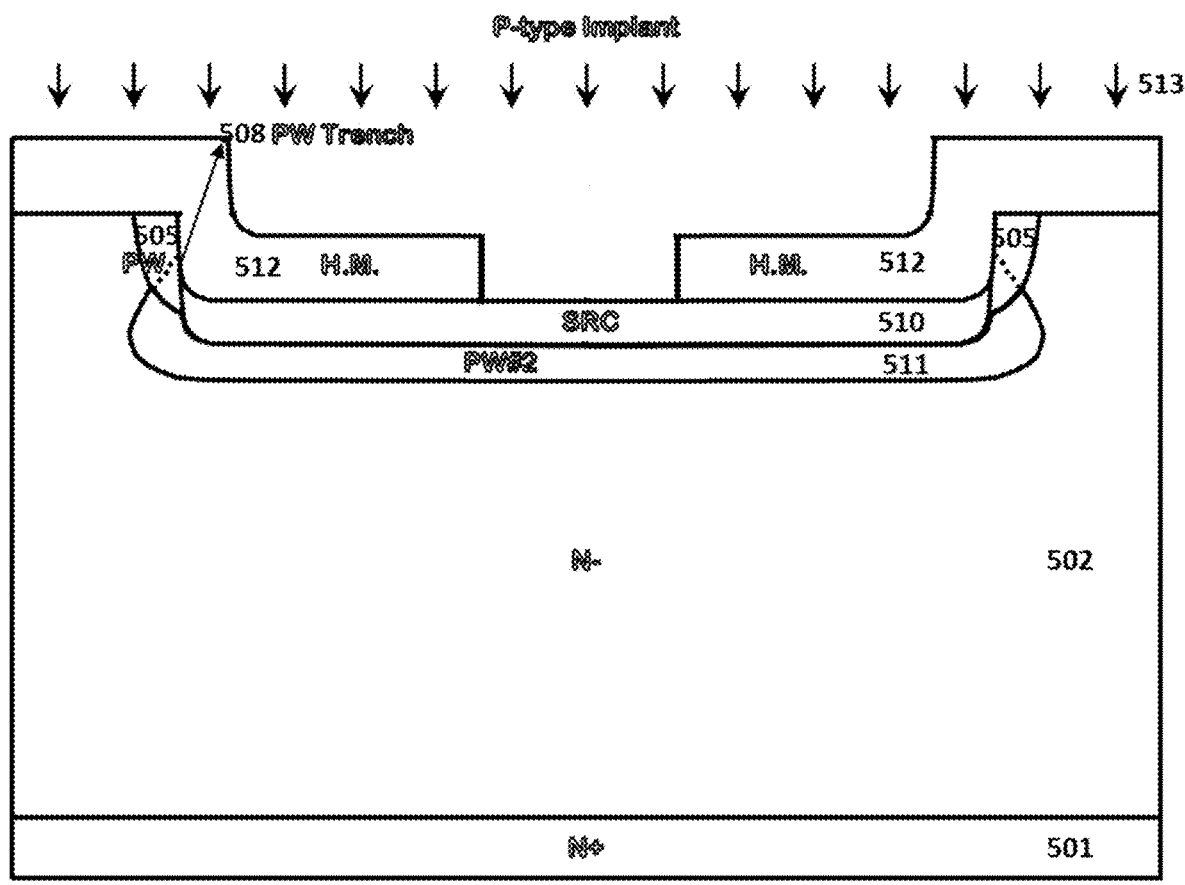
Figure 5N:
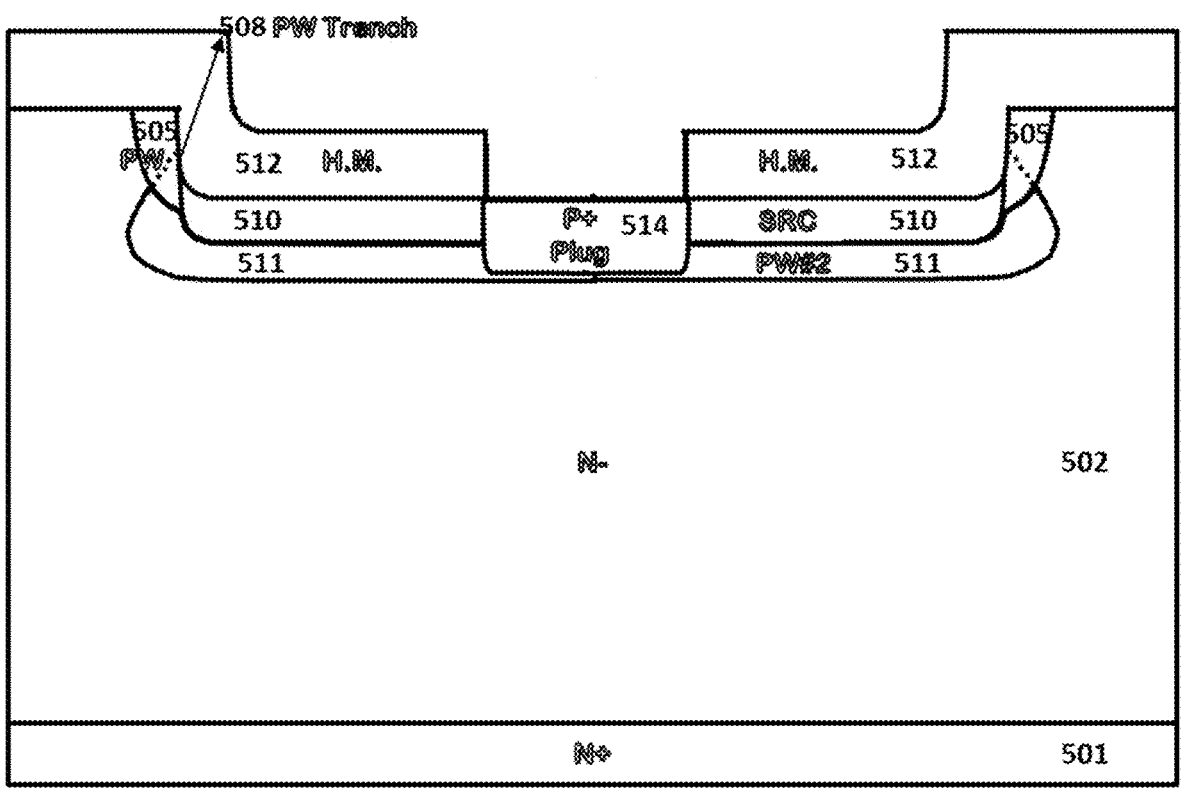
Figure 5O:
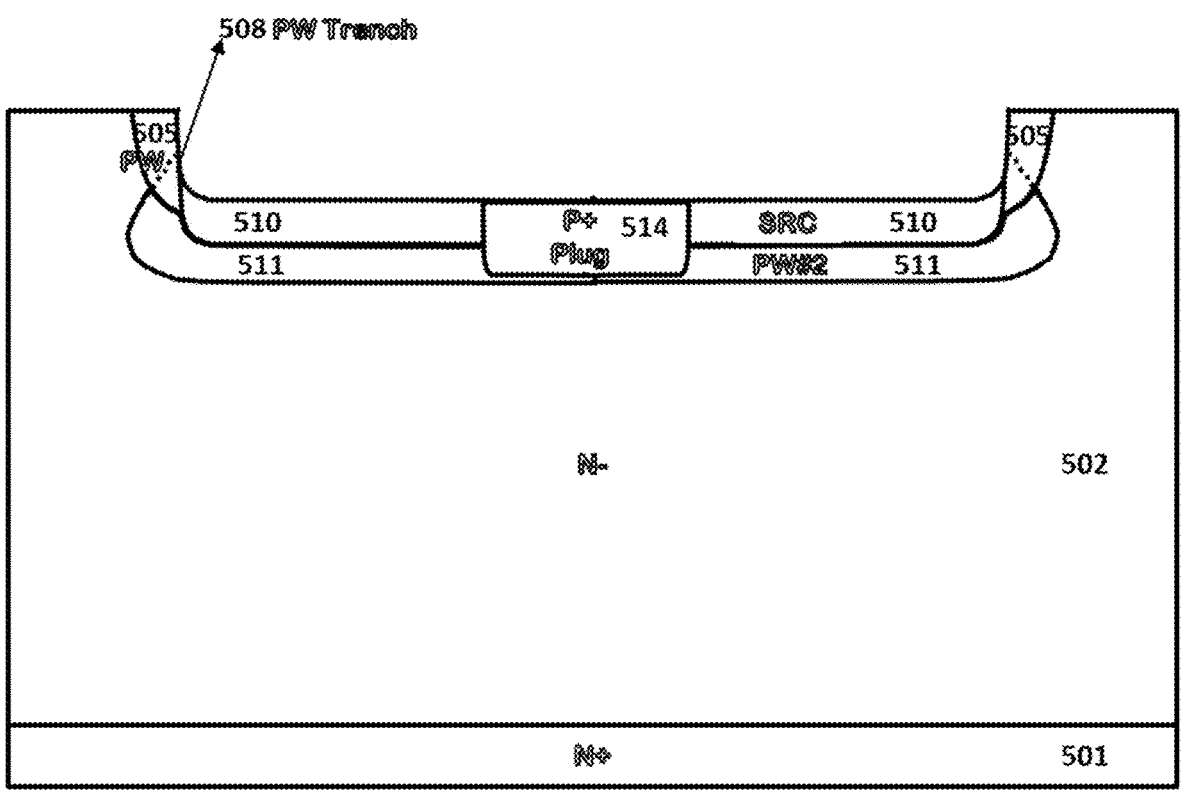
Figure 5P:
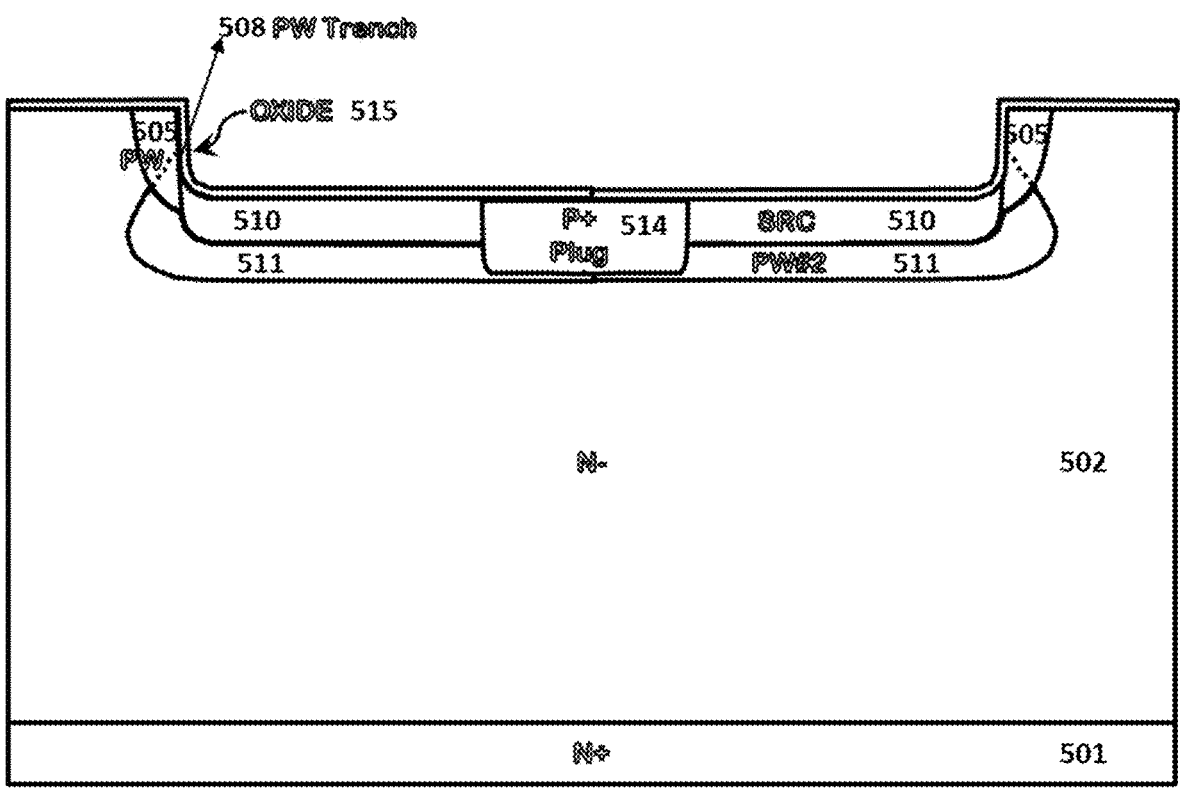
Figure 5Q:
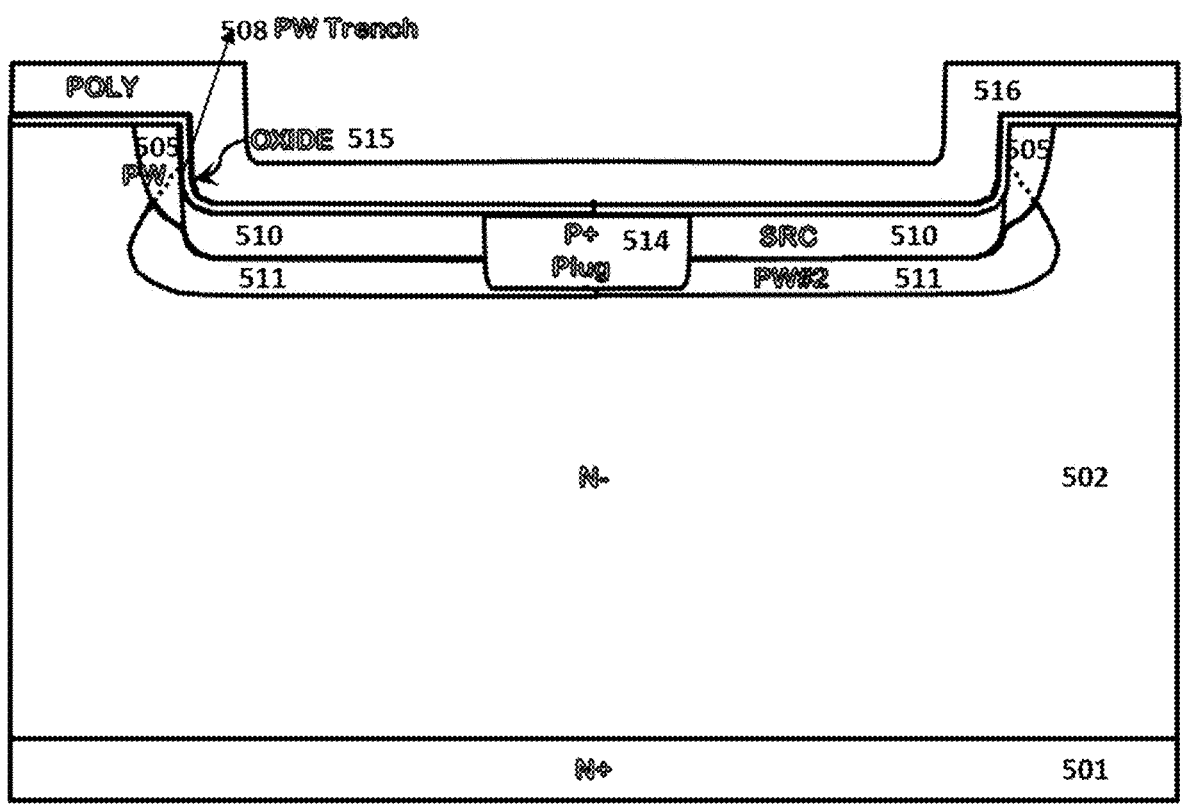
Figure 5R:
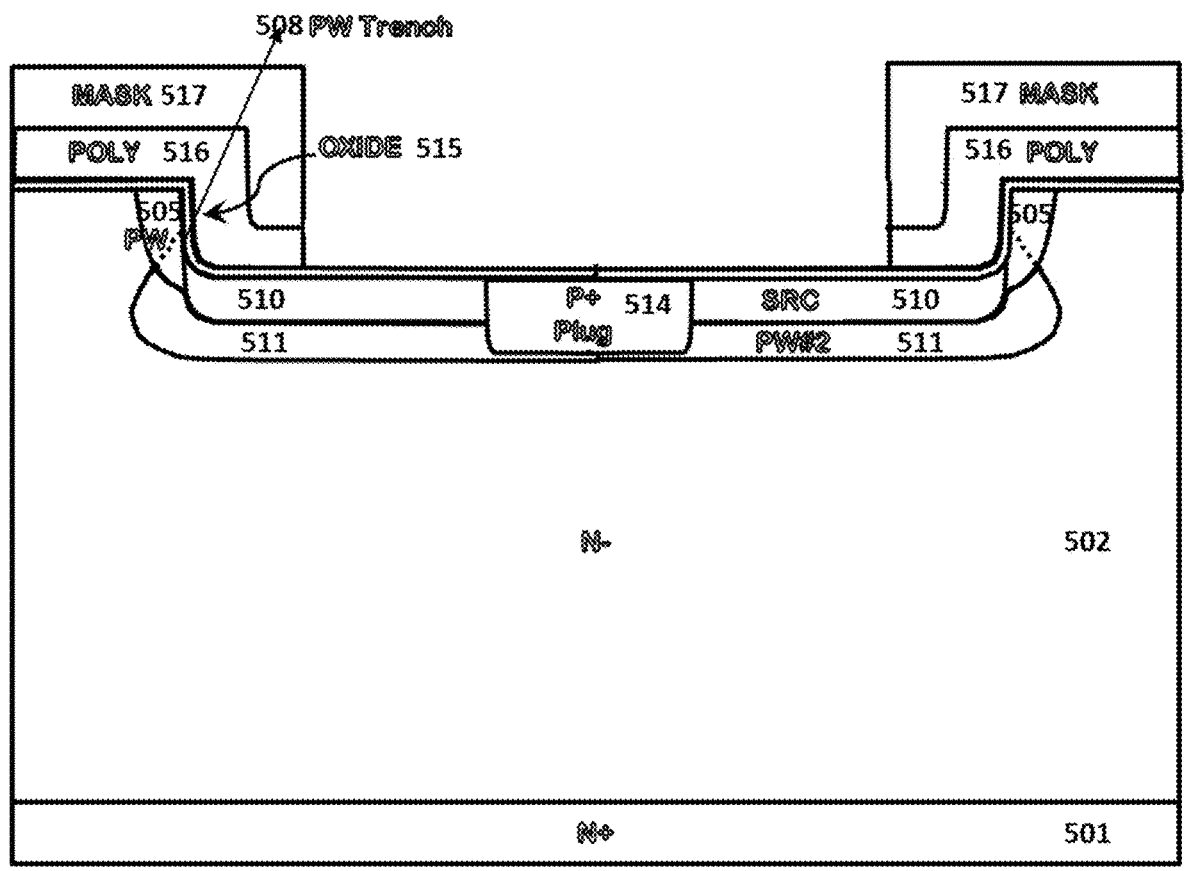
Figure 5S:
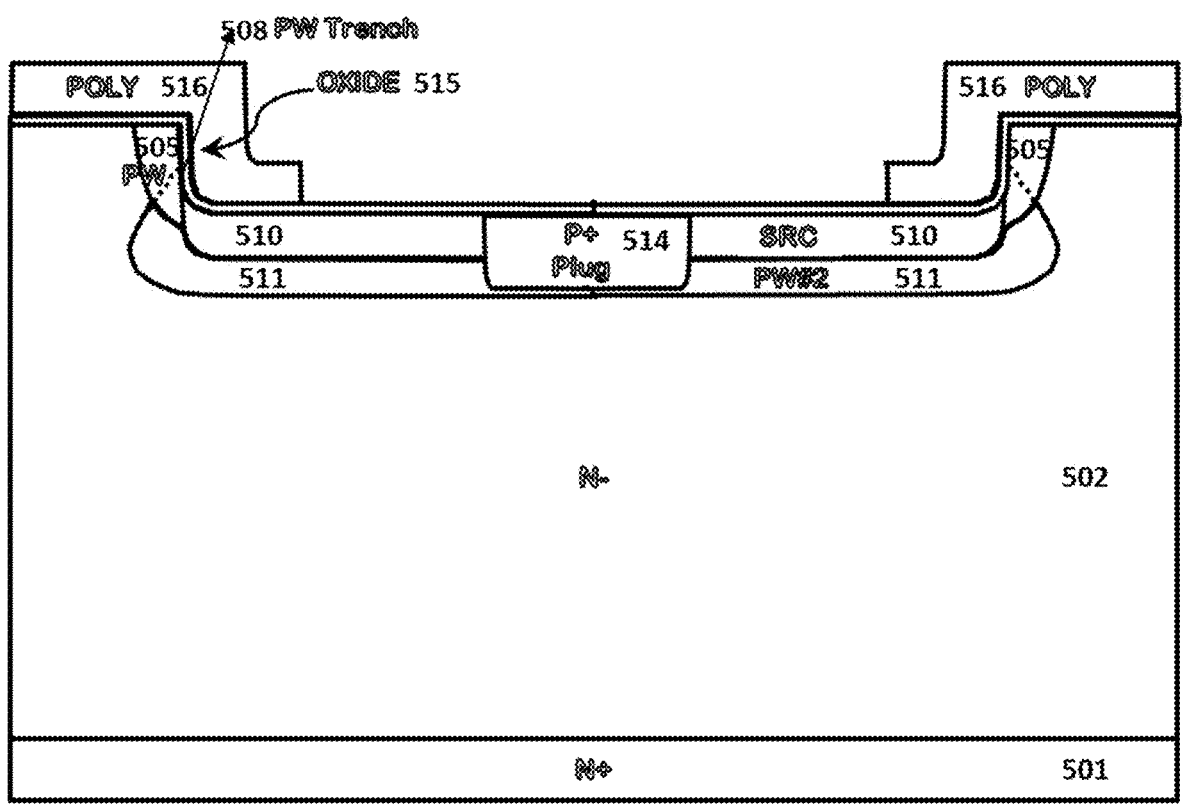
Figure 5T:
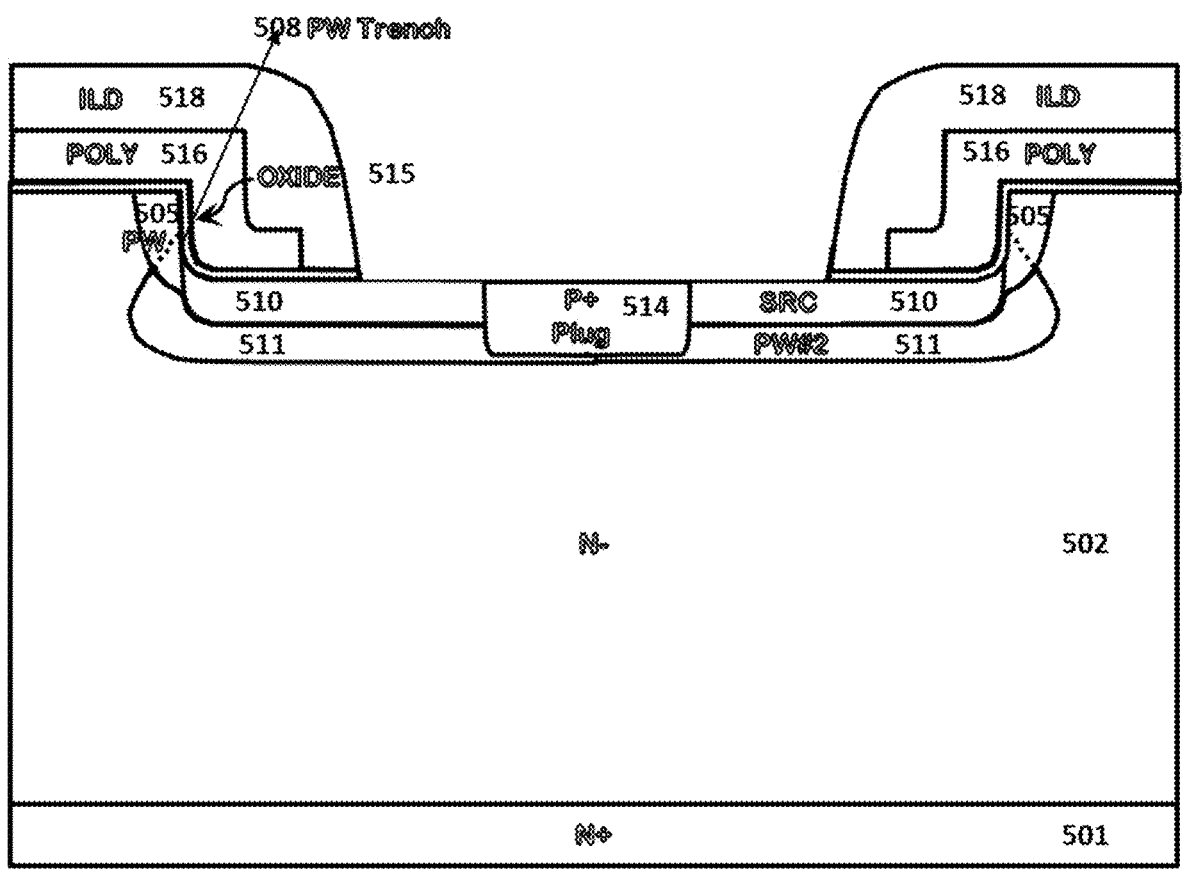
Figure 5U:
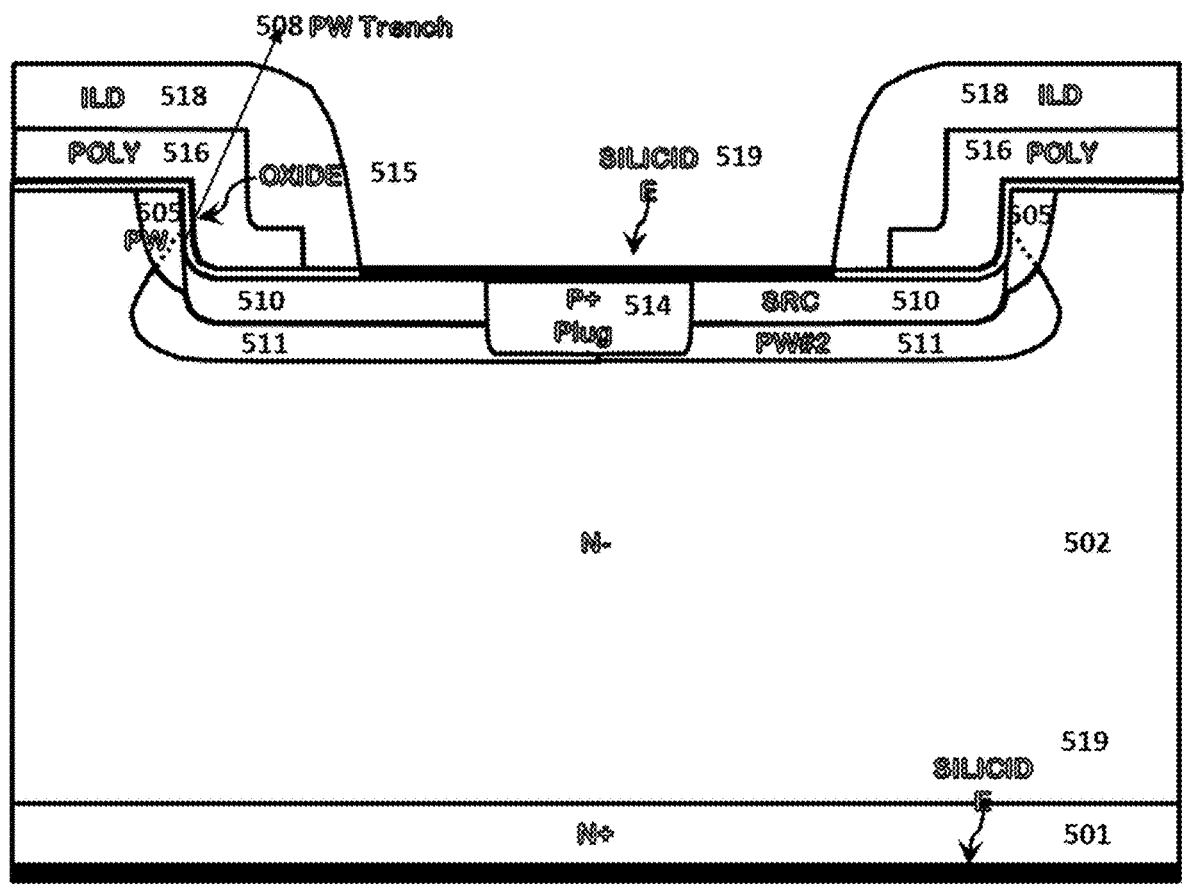
Figure 5V:
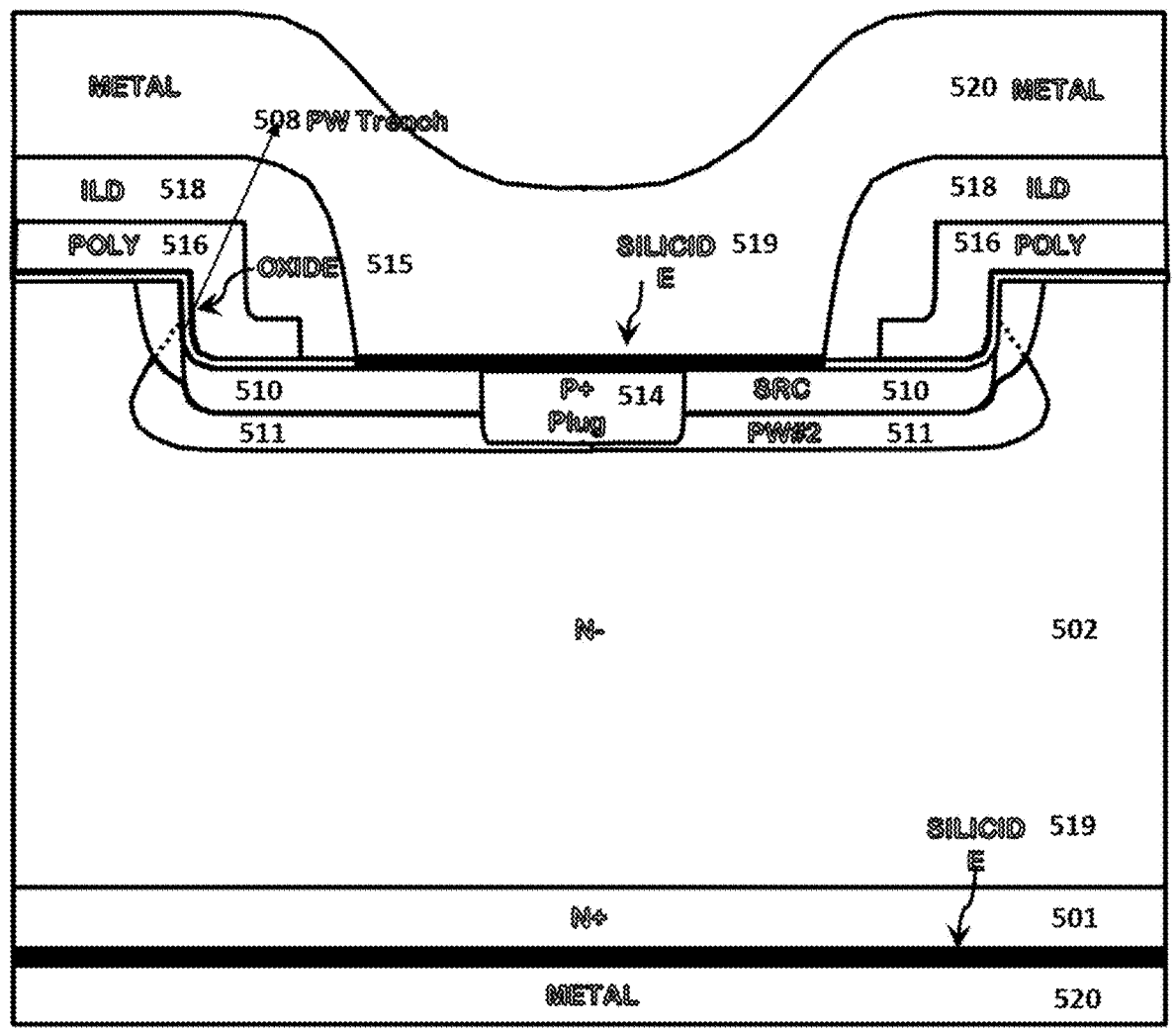

FIG. 5a to FIG. 5v describes the process of manufacturing the structure shown in FIG. 4. The manufacturing process for a SiC DMOSFET is on a SiC substrate 501 and starts with using a 4H-SiC Si-face epi-wafer with suitable doping ($10^{14}$-$10^{18}$ cm$^{-3}$) and thickness (1 µm to 300 µm) for the epilayer 502 shown in FIG. 5a. A blanket hard mask 503 comprising a CVD deposited layer of silicon dioxide, silicon nitride, silicon oxynitride, or a metallic layer such as nickel, with thickness ranging from 50 nm to 5 µm is deposited in FIG. 5b and then patterned using photolithography followed by a dry etch using a RIE for example as shown in FIG. 5c. Then p-well region is first formed by ion-implantation or epitaxial growth using aluminum or boron as the p-type impurity. A p-type implantation 504 comprising of boron or aluminum, at energies ranging from 10 keV to 800 keV, at implant doses ranging from $10^{12}$ cm$^{-2}$ to $10^{15}$ cm$^{-2}$ in FIG. 5d is performed to create a p-well 505 in FIG. 5e. The mask 503 is removed, and another hard mask layer 506 is deposited by a CVD deposited layer of silicon dioxide, silicon nitride, silicon oxynitride, or a metallic layer such as nickel, with thickness ranging from 50 nm to 5 µm and then patterned as in FIG. 5f. A deep p-well trench 508 is formed by controlled etching process 507 into the p-well region by RIE or ICP etching using the appropriately patterned hard mask layer 506 in FIG. 5g. The p-well trench 508 may be formed with a sidewall angle between 75° and 90°. The depth of the p-well trench region for example may range from 0.5 µm to 2 µm. The depth of the p-well trench 508 may be adjusted to be of the same depth or even slightly deeper than the p-well region. The bottom of the p-well trench may not be completed enclosed within the p-well region.

A N-type implant 509 is done for creating a N+ source region 510 in FIG. 5h. A N+ source region is formed by ion-implantation or by epitaxial re-growth by a n-type impurity such as nitrogen or phosphorus. A second p-well region (PW #2) 511 is then formed to a sufficient depth under the N+ source region, such that the lateral extent of the PW #2 region is larger than that of the original p-well region in FIG. 5i. Two methods for forming the PW #2 region 511 are identified. (1) A dedicated hard mask layer may be deposited and patterned with a slightly larger extent than the original p-well region, and then the ion-implantation for PW #2 may be performed. (2) Tilted ion-implantation may be advantageously used for realizing PW #2. In this implementation, the same hard mask 506 may be used for creating the p-well trench 508, N+ source region 510 and then the PW #2 region 511, whose lateral extent is made larger than the original p-well region using tilted ion-implantation of a p-type impurity.

The masking layer 506 is removed in FIG. 5j. Another hard mask layer 512 is deposited in FIG. 5k. The hard mask layer 512 is patterned in FIG. 5l. A P+ plug layer may be formed by implantation of a controlled dose of a p-type impurity 513 such as aluminum or boron in FIG. 5m. The depth of the P+ plug layer 514 may preferably exceed the depth of the N+ source implant and may even exceed the depth of the p-well region, in a particular implementation in FIG. 5n. This is followed by the removal of the hard mask 512 using either dry or wet etching techniques commonly practiced by those in the field in FIG. 5o. Then the oxide layer 515 which is the gate oxide is formed by thermal oxidation or using CVD of a dielectric layer such as silicon dioxide, silicon nitride, silicon oxynitride, etc in FIG. 5p. The thickness of the gate oxide could range from 10 nm to 100 nm. Either dry or wet thermal oxidation could be used for oxide growth. PECVD or LPCVD could be used for gate oxide deposition. A polysilicon gate layer 516 is then deposited in FIG. 5q. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. A hard mask 517 is deposited and patterned as shown in FIG. 5*r*. The polysilicon gate layer 516 is etched by using the patterned mask layer 517. The mask layer 517 is then removed in FIG. 5*s*. An ILD layer 518 comprising of 50 nm-1000 nm thick silicon dioxide, silicon nitride, silicon oxynitride layers or a stacked combination thereof is deposited on the wafer; a hard mask is deposited and patterned on top to define the ILD opening; the ILD layer 518 is patterned using the hard mask as shown in FIG. 5*t*. Further the gate oxide 515 is etched using the same mask. The mask is then removed and a nickel silicide region 519 is formed on the exposed SiC surface in FIG. 5*u*. Interconnect metal layers 520 of either aluminum, silver or gold is deposited and patterned on the top and bottom of the chip in. FIG. 5*v*.

Other embodiments are also within the scope of the following claims.

Although, various embodiments which incorporate the teachings described in detail herein, those skilled in the art can readily devise many other varied embodiments that still incorporate these teachings. For example, a complementary SiC MOSFET device with a P+ substrate, P− drift layer and P+ source can be created in a N-well region. The embodiments described are all applicable to the complementary MOSFET as well.

All documents (patents, patent publications or other publications) mentioned in the specification are incorporated herein in their entirety by reference.

The invention claimed is:

1. A device comprising a unit cell on a SiC substrate, the unit cell comprising:
  a first well region,
  a source region,
  a plug region,
  a well trench, and
  a semiconductor channel comprising a first portion and a second portion;
  wherein the first portion is located on a horizontal crystal plane of the SiC substrate and the second is located on a vertical crystal plane of the SiC substrate, and wherein the well trench has a depth that is less than that of the first well region,
  wherein the source region located is within the first well region; and wherein the horizontal crystal plane comprises a 0001 crystal plane of the SiC substrate and the vertical crystal plane comprises a 11-20 or 10-10 crystal plane of the SiC substrate.

2. The device of claim 1, wherein at least a portion of the plug region is located at a center of the unit cell.

3. The device of claim 1, wherein the plug region is located between a source interconnect metallization region and the SiC substrate.

4. The device of claim 1, wherein the plug region is located between least two well regions.

5. The device of claim 1, wherein the plug region is located between at least two source regions.

6. The device of claim 1, wherein the plug region is partially within the source region and extends beyond the source region.

7. The device of claim 1, wherein at least a portion of the first well region is located between the source region and the SiC substrate.

8. The device of claim 1, further comprising a drift layer.

9. The device of claim 8, wherein the drift layer is located on the SiC substrate.

10. The device of claim 9, wherein the unit cell is located within the drift layer.

11. The device of claim 1, further comprising a second well region.

12. The device of claim 11, wherein the second well region has a depth that is equal to or deeper than the first well region.

13. The device of claim 11, wherein the second well region is located under and around the source region.

14. The device of claim 11, wherein a lateral extent of the second well region is larger than the first well region.

15. The device of claim 11, wherein the second well region is located between the source region and the SiC substrate.

16. The device of claim 1, wherein the device comprises a n-type MOSFET or p-type MOSFET.

17. The device of claim 1, wherein the device comprises a n-type DMOSFET or p-type DMOSFET.

18. The device of claim 1, further comprising a drain region and a gate region.

19. The device of claim 1, further comprising an interlayer dielectric.

* * * * *